US012700655B2

(12) United States Patent
Jogalekar et al.

(10) Patent No.: US 12,700,655 B2
(45) Date of Patent: Aug. 4, 2026

(54) MICROELECTRONIC DEVICE PACKAGE WITH INTEGRAL WAVEGUIDE TRANSITION

(71) Applicant: Texas Instruments Incorporated, Dallas, TX (US)

(72) Inventors: Aditya Nitin Jogalekar, Dallas, TX (US); Harshpreet Singh Phull Bakshi, Dallas, TX (US); Rajen Murugan, Dallas, TX (US); Sylvester Ankamah-Kusi, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 317 days.

(21) Appl. No.: 18/353,074

(22) Filed: Jul. 15, 2023

(65) Prior Publication Data

US 2024/0021971 A1 Jan. 18, 2024

Related U.S. Application Data

(60) Provisional application No. 63/368,619, filed on Jul. 15, 2022.

(51) Int. Cl.
H01P 5/107 (2006.01)
H01Q 1/22 (2006.01)
(Continued)

(52) U.S. Cl.
CPC .......... H01P 5/107 (2013.01); H01Q 1/2283 (2013.01); H05K 1/024 (2013.01); H05K 1/0243 (2013.01); H05K 1/112 (2013.01); H05K 3/4644 (2013.01); H10W 44/20 (2026.01); H05K 2201/10098 (2013.01); H10W 44/219 (2026.01)

(58) Field of Classification Search
CPC .......... H01P 5/107; H01P 1/047; H01L 23/66; H01L 2223/6633; H01L 2223/6627; H01L 2223/6677; H01Q 1/2283; H05K 1/024; H05K 1/0243; H05K 1/112; H05K 3/4644; H05K 2201/10098
See application file for complete search history.

(56) References Cited

U.S. PATENT DOCUMENTS

| | | | |
|---|---|---|---|
| 8,692,731 B2 * | 4/2014 | Lee .......................... | H01P 3/121 |
| | | | 343/785 |
| 9,647,329 B2 * | 5/2017 | Herbsommer .... | H01L 23/49517 |
| 2014/0240187 A1 * | 8/2014 | Herbsommer ......... | H05K 1/024 |
| | | | 343/785 |

* cited by examiner

*Primary Examiner* — John W Poos
(74) *Attorney, Agent, or Firm* — Xiaotun Qiu; Frank D. Cimino

(57) ABSTRACT

An example device includes: a multilayer build-up package substrate including trace conductor layers spaced from one another by dielectric material, and further including connection conductor layers coupling portions of the trace conductor layers through dielectric material, the multilayer build-up package substrate having a device side surface with one of the trace conductor layers and an opposing board side surface with one of the connection conductor layers; and a waveguide transition formed from the multilayer build-up package substrate, the waveguide transition having an input port formed from the connection conductor layer on the board side surface, and having at least two sub-transitions spaced laterally from one another, the at least two sub-transitions to couple a signal from the input port through the trace conductor layers and the connection conductor layers to a coplanar waveguide formed from the trace conductor layer on the device side surface.

32 Claims, 20 Drawing Sheets

(51) Int. Cl.

| | | |
|---|---|---|
| *H05K 1/02* | (2006.01) |
| *H05K 1/11* | (2006.01) |
| *H05K 3/46* | (2006.01) |
| *H10W 44/20* | (2026.01) |

FIG. 4A

FROM FIG. 4A STEP 409

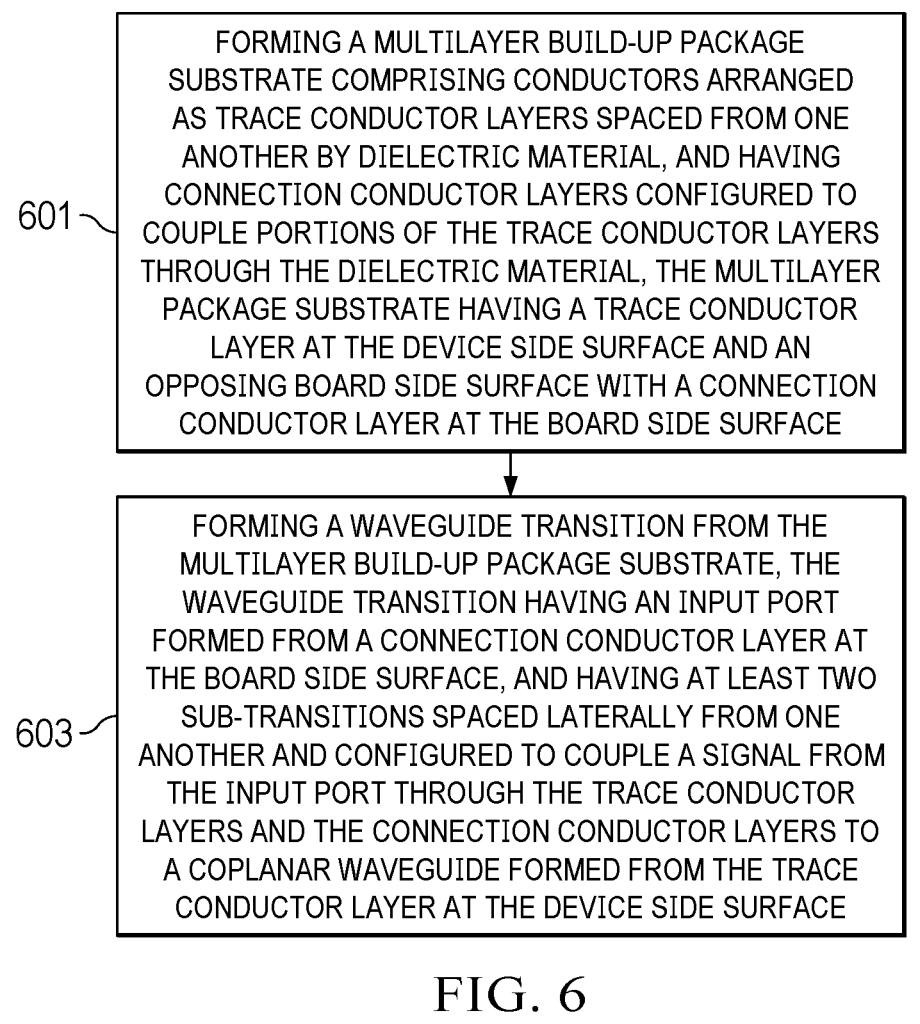

601 — FORMING A MULTILAYER BUILD-UP PACKAGE SUBSTRATE COMPRISING CONDUCTORS ARRANGED AS TRACE CONDUCTOR LAYERS SPACED FROM ONE ANOTHER BY DIELECTRIC MATERIAL, AND HAVING CONNECTION CONDUCTOR LAYERS CONFIGURED TO COUPLE PORTIONS OF THE TRACE CONDUCTOR LAYERS THROUGH THE DIELECTRIC MATERIAL, THE MULTILAYER PACKAGE SUBSTRATE HAVING A TRACE CONDUCTOR LAYER AT THE DEVICE SIDE SURFACE AND AN OPPOSING BOARD SIDE SURFACE WITH A CONNECTION CONDUCTOR LAYER AT THE BOARD SIDE SURFACE

603 — FORMING A WAVEGUIDE TRANSITION FROM THE MULTILAYER BUILD-UP PACKAGE SUBSTRATE, THE WAVEGUIDE TRANSITION HAVING AN INPUT PORT FORMED FROM A CONNECTION CONDUCTOR LAYER AT THE BOARD SIDE SURFACE, AND HAVING AT LEAST TWO SUB-TRANSITIONS SPACED LATERALLY FROM ONE ANOTHER AND CONFIGURED TO COUPLE A SIGNAL FROM THE INPUT PORT THROUGH THE TRACE CONDUCTOR LAYERS AND THE CONNECTION CONDUCTOR LAYERS TO A COPLANAR WAVEGUIDE FORMED FROM THE TRACE CONDUCTOR LAYER AT THE DEVICE SIDE SURFACE

FIG. 6

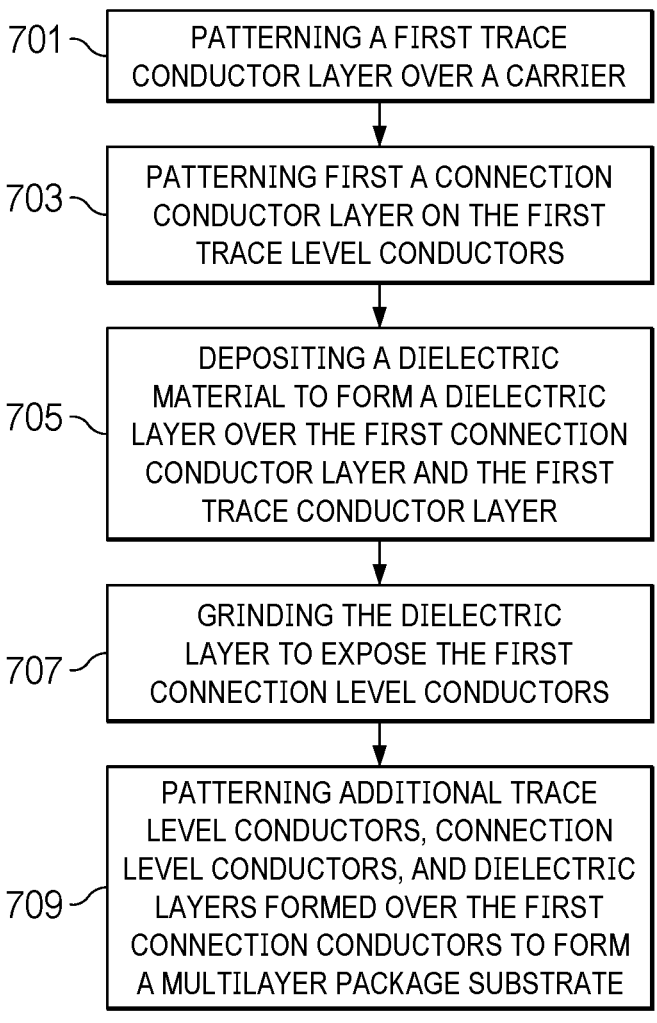

701 — PATTERNING A FIRST TRACE CONDUCTOR LAYER OVER A CARRIER

703 — PATTERNING FIRST A CONNECTION CONDUCTOR LAYER ON THE FIRST TRACE LEVEL CONDUCTORS

705 — DEPOSITING A DIELECTRIC MATERIAL TO FORM A DIELECTRIC LAYER OVER THE FIRST CONNECTION CONDUCTOR LAYER AND THE FIRST TRACE CONDUCTOR LAYER

707 — GRINDING THE DIELECTRIC LAYER TO EXPOSE THE FIRST CONNECTION LEVEL CONDUCTORS

709 — PATTERNING ADDITIONAL TRACE LEVEL CONDUCTORS, CONNECTION LEVEL CONDUCTORS, AND DIELECTRIC LAYERS FORMED OVER THE FIRST CONNECTION CONDUCTORS TO FORM A MULTILAYER PACKAGE SUBSTRATE

FIG. 7

MICROELECTRONIC DEVICE PACKAGE WITH INTEGRAL WAVEGUIDE TRANSITION

CROSS-REFERENCE TO RELATED APPLICATIONS

This application claims the benefit of and priority to U.S. Provisional Application No. 63/368,619, filed Jul. 15, 2022, which Application is hereby incorporated herein by reference in its entirety.

TECHNICAL FIELD

This disclosure relates generally to microelectronic device packages, and more particularly to microelectronic device packages including one or more integrated waveguide transitions.

BACKGROUND

In systems using high frequency signals, such as microwave or millimeter wave signals, transitions between carriers are needed. For example, a signal may be traversing a substrate integrated waveguide ("SIW") in a printed circuit board ("PCB") substrate. The SIW can be a microstrip carrying the signal. The signal needs to be coupled to an antenna or perhaps to another waveguide, such as a coplanar waveguide or a grounded coplanar waveguide (GCPW) that can then carry the signal onwards. Waveguide transition devices are used to couple signals between different types of transmission lines. Processes for producing waveguide transition devices for millimeter wave or microwave signals include forming a transition within a substrate of dielectric and conductor materials, for example using a dedicated multilayer PCB can be used. To couple a signal traversing a SIW in a PCB to an antenna or to a grounded coplanar waveguide (GCPW), a waveguide transition device is mounted to the PCB and contacts a pin carrying signal, in an example the pin can be surrounded by a ground plane on a surface of the PCB. The pin is coupled at a board side surface of the transition device to conductors extending through the transition device to an antenna, or to a GCPW, that is formed on a surface of the transition device opposite the board side surface. To avoid losses, the transition device should be designed with impedance matching, for example to provide a low impedance load such as about 50 ohms, or less. Further the transition should exhibit low losses such as −10 dB reflection loss over the frequencies of interest. When using PCB materials for millimeter wave frequency signals, and for higher frequency signals of greater than about 30 GHz, the design of the transition device becomes increasingly difficult and, for some materials used for millimeter wave transition devices, it may be impossible to design a transition that meets the low impedance, low loss goals for the system. In addition, custom PCB transition devices with the required performance are relatively high in cost.

Incorporating antennas with a high frequency waveguide transition in a microelectronic device package is also desirable. Antennas are increasingly used with microelectronic devices and portable devices, such as communications systems, communications devices including 4G, 5G or LTE capable cellphones, tablets, and smartphones. Additional applications for the integrated antennas include microelectronic devices in automotive systems such as radar, navigation and over the air communications systems. Autonomous vehicles, robots, and factory automation systems can use the devices for navigation, accident avoidance, and control. Frequencies used can include millimeter wave and other GHz frequencies, as well as other radio or microwave frequencies.

Semiconductor devices may also be integrated with a transition. Conventional devices using antennas with packaged semiconductor devices often place the antennas on a high-performance circuit substrate such as those used for a printed circuit board, an organic substrate or other low dielectric circuit board substrate. A semiconductor device can be mounted to the high-performance substrate, near the antenna or antennas. Conventional approaches often employ expensive printed circuit board ("PCB") substrates, which are sometimes used inside a molded microelectronic device package with mold compound covering the semiconductor devices. These solutions are relatively high in cost and require substantial device and board area. Forming microelectronic device packages including efficient and cost-effective transitions, antennas, and/or semiconductor devices within microelectronic device packages remains challenging.

SUMMARY

A described method includes: forming a multilayer build-up package substrate including conductors arranged as trace conductor layers spaced from one another by dielectric material, and comprising connection conductor layers coupling portions of the trace conductor layers through the dielectric material, the multilayer package substrate having a trace conductor layer at the device side surface and an opposing board side surface with a connection conductor layer at the board side surface; and forming a waveguide transition from the multilayer build-up package substrate, the waveguide transition having an input port formed from a connection conductor layer at the board side surface, and having at least two sub-transitions spaced laterally from one another to couple a signal from the input port through the trace conductor layers and the connection conductor layers to a coplanar waveguide formed from the trace conductor layer at the device side surface.

In a described example, a microelectronic device package includes a multilayer build-up package substrate including conductors arranged as trace conductor layers spaced from one another by dielectric material, and including conductors arranges as connection conductor layers configured to couple portions of the trace conductor layers through the dielectric material, the multilayer package substrate having a device side surface with a trace conductor layer at the device side surface and an opposing board side surface with a connection conductor layer at the board side surface. The microelectronic device package includes a waveguide transition formed from the multilayer build-up package substrate, the waveguide transition having an input port formed from the connection conductor layer at the board side surface, and having at least two sub-transitions spaced laterally from one another and coupling a signal from the input port through the trace conductor layers to a coplanar waveguide formed from the trace conductor layer at the device side surface; and mold compound covering the device side surface of the multilayer build-up package substrate.

In another described example, a device includes: a multilayer build-up package substrate including trace conductor layers spaced from one another by dielectric material, and further comprising connection conductor layers configured to couple portions of the trace conductor layers through the dielectric material, the multilayer build-up package substrate having a device side surface with one of the trace conductor layers at the device side surface and an opposing board side surface with one of the connection conductor layers at the board side surface; and a waveguide transition formed from the multilayer build-up package substrate, the waveguide transition having an input port formed from the connection conductor layer at the board side surface, and having at least two sub-transitions spaced laterally from one another, the at least two sub-transitions coupling a signal from the input port through the trace conductor layers and the connection conductor layers to a coplanar waveguide formed from the trace conductor layer at the device side surface.

BRIEF DESCRIPTION OF THE DRAWINGS

FIGS. 4A-4B illustrate, in a series of cross-sectional views, the major steps in manufacturing a multilayer build-up package substrate that can be used in the arrangements.

FIGS. 5BB, 5CC, and FIG. 5DD illustrate S-parameter graphs for sub-transitions shown in FIGS. 5B, and FIG. 5D, respectively.

FIG. 6 illustrates, in a flow diagram, steps for forming an arrangement.

FIG. 7 illustrates, in a flow diagram, steps for forming a multilayer build-up package substrate for use in an arrangement.

DETAILED DESCRIPTION

Figure 1A:
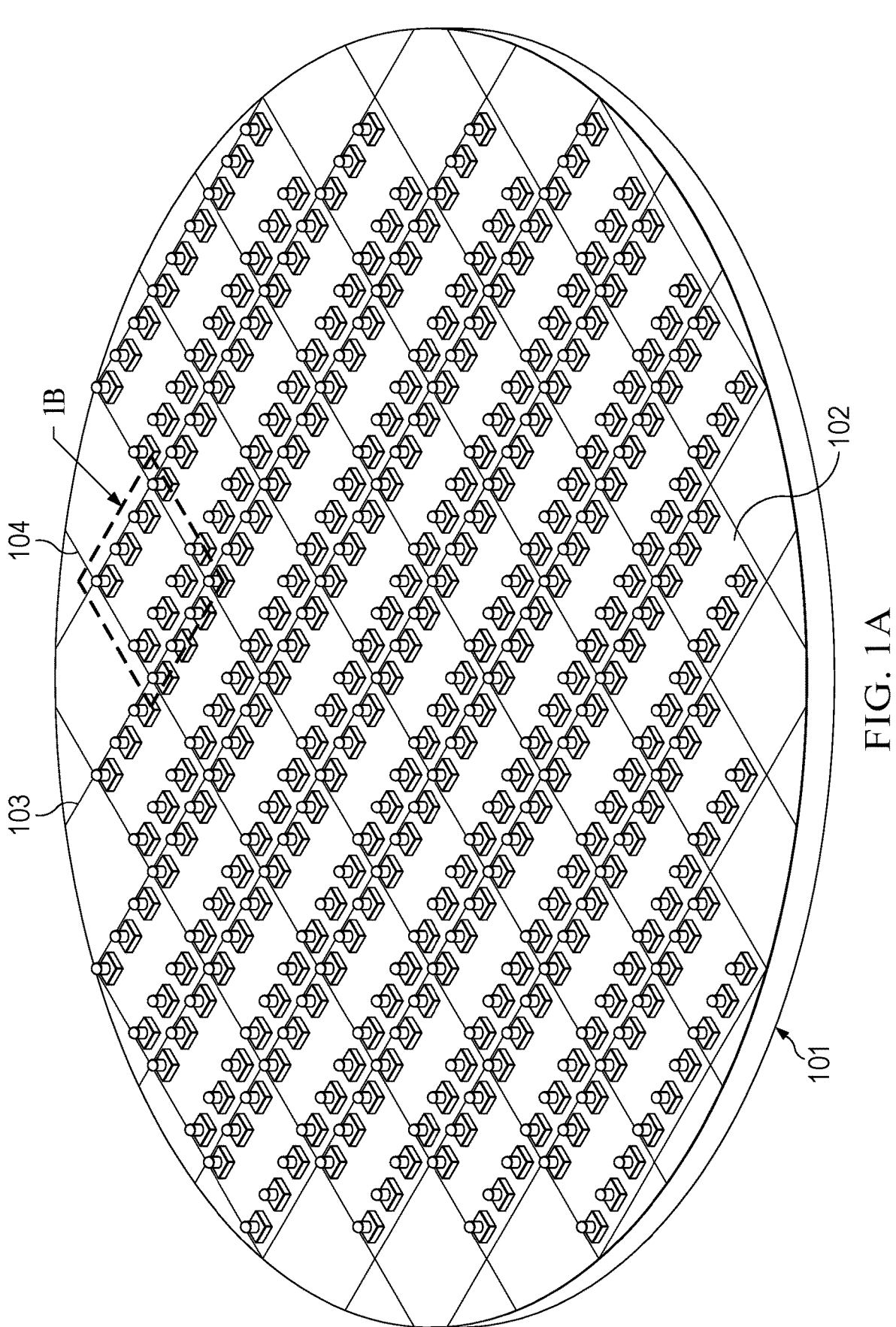
FIGS. 1A-1B illustrate, in a projection view and a close-up projection view, respectively, semiconductor dies on a semiconductor wafer and an individual semiconductor die from the semiconductor wafer, for use with the arrangements.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor device" is used herein. A semiconductor device can be a discrete semiconductor device such as a bipolar transistor, a few discrete devices such as a pair of power field effect transistor ("FET") switches fabricated together on a single semiconductor die, or a semiconductor device can be an integrated circuit with multiple semiconductor devices such as the multiple capacitors in an A/D converter. The semiconductor device can include passive devices such as resistors, inductors, filters, sensors, or active devices such as transistors. The semiconductor device can be an integrated circuit with hundreds or thousands of transistors coupled to form a functional circuit, for example a microprocessor or memory device. The semiconductor device can be a radio transceiver or a radar transceiver. The semiconductor device can be a receiver, transmitter or transceiver. When semiconductor devices are fabricated on a semiconductor wafer and then individually separated from the semiconductor wafer, the individual units are referred to as "semiconductor dies." A semiconductor die is also a semiconductor device.

The term "microelectronic device package" is used herein. A microelectronic device package has at least one semiconductor die electrically coupled to terminals, and has a package body that protects and covers the semiconductor die. The microelectronic device package can include additional elements, in some arrangements an integrated antenna is included. Passive components such as capacitors, resistors, and inductors or coils can be included. In some arrangements, multiple semiconductor dies can be packaged together. The semiconductor die is mounted to a package substrate that provides conductive leads; a portion of the conductive leads form the terminals for the packaged device. The semiconductor die can be mounted to the package substrate with a device side surface facing away from the substrate and a backside surface facing and mounted to a die pad of the package substrate. In wire bonded semiconductor device packages, bond wires couple conductive leads of a package substrate to bond pads on the semiconductor die. Alternatively, the semiconductor die can be mounted with a device side facing towards the package substrate using conductive post connects in a flip chip package. The microelectronic device package can have a package body formed by a thermoset epoxy resin in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions provide the terminals for the microelectronic device package.

The term "package substrate" is used herein. A package substrate is a substrate arranged to receive a semiconductor die and to support the semiconductor die in a completed semiconductor device package. Package substrates useful with the arrangements include conductive lead frames, molded interconnect substrates (MIS), partially etched lead frames, pre-molded lead frames, and multilayer package substrates. In some arrangements, a flip chip die mount is used, where post connects that extend from bond pads on the semiconductor device are attached by a solder joint to conductive lands on the device side surface of the package substrate. The post connects can be solder bumps or other conductive materials such as copper or gold with solder on a distal end. Copper pillar bumps can be used. In alternative arrangements using wire bonded packages, bond wires can couple bond pads on the semiconductor dies to the leads on the device side surface of the package substrate.

The term "multilayer build-up package substrate" is used herein. A multilayer build-up package substrate has multiple conductor layers including trace conductor layers, and has connection conductor layers extending through the dielectric material between the trace conductor layers. In an example arrangement, a multilayer build-up package substrate is formed in an additive manufacturing process by plating a patterned trace conductor layer and then covering the trace conductor layer, and in some examples a connection conductor layer plated over the trace conductor layer, with a layer of dielectric material. Grinding or thinning can be performed on the dielectric material to expose portions of the top surface of the layer of conductors from the dielectric material. Additional plating layers can be formed to add additional levels of trace conductor layers, some of which are trace conductor layers that are coupled to other trace conductor layers in the dielectric materials by connection conductor layers extending through the dielectric material, and additional dielectric material can be deposited at each trace conductor layer and can cover the conductors. By using an additive or build-up manufacturing approach, and by performing multiple plating steps, multiple dielectric formation steps, and multiple grinding steps, a multilayer build-up package substrate is formed with an arbitrary number of trace conductor layers and connection conductor layers between and coupling portions of the trace conductor layers.

The terms "stripline" and "asymmetric stripline" are used herein. A stripline is a transmission medium that includes a flat conductor line in a dielectric medium with ground planes spaced from and formed above or below the stripline. Symmetric striplines are placed evenly between the ground planes. Asymmetric striplines, which are used in the example arrangements described and illustrated herein, are placed closer to one ground plane than the other, to better direct radiated or reflected energy in a desired direction. However, even when asymmetric striplines are shown as examples, symmetric striplines can also be used (with different performance, however).

In an example arrangement, conductor layers of copper, gold, aluminum, silver or an alloy thereof are formed by plating, and a thermosetting resin material can be used as the dielectric material. The connector conductor layers between trace conductor layers can be of arbitrary shapes and sizes and can include rails and pads extending through the dielectric to couple trace conductor layers with low resistance. Unlike conventional vias formed in a printed circuit board technology, the connection conductor layers extending through the dielectric material are not formed in holes mechanically drilled through a rigid dielectric material, which are limited in size and shape. Instead, in the arrangements, an additive build-up manufacture approach forms the connection conductor layers by plating during the additive manufacturing process, and thus the connection level conductors can have a variety of shapes and sizes. When a connection similar to a via is used in the arrangements, the term "via shaped portion" is used herein to describe a connection conductor layer that is patterned to form a round or circular column connection, shaped similar to a via in a PCB board, between trace conductor layers. Other shapes, such one that are rectangular, square, or oval in cross section, could be used as "via shaped portions".

In packaging microelectronic and semiconductor devices, mold compound may be used to partially cover a package substrate, to cover components, to cover a semiconductor die, and to cover the electrical connections from the semiconductor die to the package substrate. This molding process can be referred to as an "encapsulation" process, although some portions of the package substrates are not covered in the mold compound during encapsulation, for example terminals and leads are exposed from the mold compound to enable electrical connections to the packaged device. Encapsulation is often a compressive molding process, where thermoset mold compound such as resin epoxy can be used. A room temperature solid or powdered mold compound can be heated to a liquid state and then molding can be performed by pressing the liquid mold compound into a mold through runners or channels. Transfer molding can be used. Unit molds shaped to surround an individual device may be used, or block molding may be used, to form multiple packages simultaneously for several devices from mold compound. The devices to be molded can be provided in an array or matrix of several, hundreds or even thousands of devices in rows and columns that are then molded together.

After the molding process is complete, the individual microelectronic device packages are cut apart from each other in a sawing operation by cutting through the mold compound and package substrate in saw streets formed between the devices. Portions of the package substrate leads are exposed from the mold compound package to form terminals for the packaged semiconductor device.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser, or other cutting tool to pass between the molded electronic devices to separate the devices from one another. This process is another form of singulation. When the molded electronic devices are provided in a strip with one device adjacent to another device along the strip, the saw streets are parallel and normal to the length of the strip. When the molded electronic devices are provided in an array of devices in rows and columns, the saw streets include two groups of parallel saw streets, the two groups are normal to each other, and the saw will traverse the molded electronic devices in two different directions to cut apart the packaged electronic devices from one another in the array.

The term "quad flat no-lead" (QFN) is used herein for a type of electronic device package. A QFN package has conductive leads that are coextensive with the sides of a molded package body, and in a quad package the leads are on four sides. Alternative flat no-lead packages may have leads on two sides or only on one side. These can be referred to as small outline no-lead or SON packages. No-lead packaged electronic devices can be surface mounted to a board. Small outline no-lead (SON) packages can be used with the arrangements. The microelectronic device package of the example arrangements can be mounted to a system board using solder, for example using surface mount technology ("SMT") solder mounting.

The term "antenna" is used herein. As used herein, an antenna is a structure arranged to transmit or receive signals, such as radio frequency signals, microwave, millimeter wave or radar signals.

The term "waveguide transition" is used herein. A waveguide transition is a device that couples a radio frequency signal from one type of carrier to another, for example from a stripline to a coplanar waveguide. In an example arrangement, a waveguide transition is formed using a multilayer build-up package substrate to couple an input port at a board side surface of the multilayer build-up package substrate to a coplanar waveguide formed on a device side surface of the multilayer build-up package substrate. The term "sub-transition" is used herein. A sub-transition is a device that couples a signal from one layer of the multilayer build-up package substrate to another layer. By using at least two sub-transitions, the arrangements form a waveguide transition between an input port and a co-planar waveguide. The radio frequency signal can be carried on striplines, such as asymmetric striplines, between the sub-transitions in the waveguide transition. Symmetric striplines can also be used.

In the arrangements, a microelectronic device package includes at least one waveguide transition formed on a multilayer build-up package substrate. In some examples, a semiconductor die such a radio frequency (RF) transceiver device can be mounted to the multilayer build-up package substrate that includes an integral waveguide transition. In operation, the semiconductor die can then transceive radio frequency signals (which includes signals at microwave and millimeter wave frequencies, WR5 frequency signals, and other high frequency signals) using the waveguide transition.

In another example arrangement, one or more antennas are formed on the multilayer build-up package substrate and coupled to the waveguide transition, these antennas can be designed for a particular frequency and application, such as millimeter wave signals. In example arrangements, the waveguide transition can be formed in the multilayer build-up package substrate, in a more particular example a three or more-conductor layer multilayer build-up package substrate can be used. In some examples the multilayer build-up package substrate can also be used to mount a semiconductor die and to couple the semiconductor die to an antenna using a coplanar waveguides formed on the multilayer build-up package substrate. The multilayer build-up package substrate can include routing conductors that form connections between the semiconductor die, the antenna, and terminals of the microelectronic device package formed on a board side surface of the package substrate. Use of the multilayer build-up package substrate to form the waveguide transition, the antenna (in some examples) and routing conductors to mount the semiconductor die (in further examples) allows for a less expensive microelectronic device package with an integral waveguide transition (when compared to discrete laminates used in prior approaches), reduces costs, and can reduce the overall size of the microelectronic device package (compared to discrete transition devices mounted in or to microelectronic device packages without the use of the arrangements).

In some example arrangements, the multilayer build-up package substrate has a device side surface with a coplanar waveguide. In additional example arrangements, a semiconductor die is mounted on a portion of the device side surface and is coupled to the coplanar waveguide. In some examples, an antenna or an array of antennas is formed on the device side surface of the multilayer build-up package substrate. In a particular example, an antenna is coupled to and spaced from a semiconductor die. A semiconductor die mounted to the device side surface of the multilayer build-up package substrate can be coupled to the antenna or antennas by conductive traces formed in trace conductor layers. In one example, the semiconductor die can be flip chip mounted to a device side surface of a multilayer build-up package substrate that includes the waveguide transition. In some arrangements, the semiconductor die and the antenna in the multilayer build-up package substrate can be completely covered by mold compound or another encapsulation material such as an epoxy or resin. In another arrangement, a protective lid or cover can be mounted over the semiconductor die and the device side surface of the multilayer build-up package substrate to complete the microelectronic device package.

In an example arrangement, a waveguide transition integral to the microelectronic device package is arranged to operate in the millimeter wave frequency range, between 30 GHz and 300 GHz, with signals having wavelengths (in air) between 10 millimeters and 1 millimeter. Other frequency signals such as RF signals can be used with the transition device. In a particular example, the waveguide transition is arranged for signals in the WR5 or "G band" frequencies (which range from 140 GHz-220 GHz).

The semiconductor device die used in example arrangements can be a monolithic millimeter wave integrated circuit ("MMIC"). The MMIC can be a transmitter, receiver, transceiver, or a component in a system for transmitting or receiving signals. The semiconductor die can be provided as multiple semiconductor dies or as a single semiconductor die. Additional components such as passive components or filters can be mounted to the multilayer build-up package substrate, to form a millimeter wave radio frequency system. Additional passive components can be formed in the multilayer package substrate using the conductors and dielectric material, for example capacitors can be formed. Millimeter wave transition devices can be formed to couple signals to an antenna. Coplanar waveguides can be formed in the waveguide transition of the multilayer build-up package substrate to couple a semiconductor die to a PCB board with a substrate integrated waveguide, or to an antenna or antennas, or both.

Figure 1B:
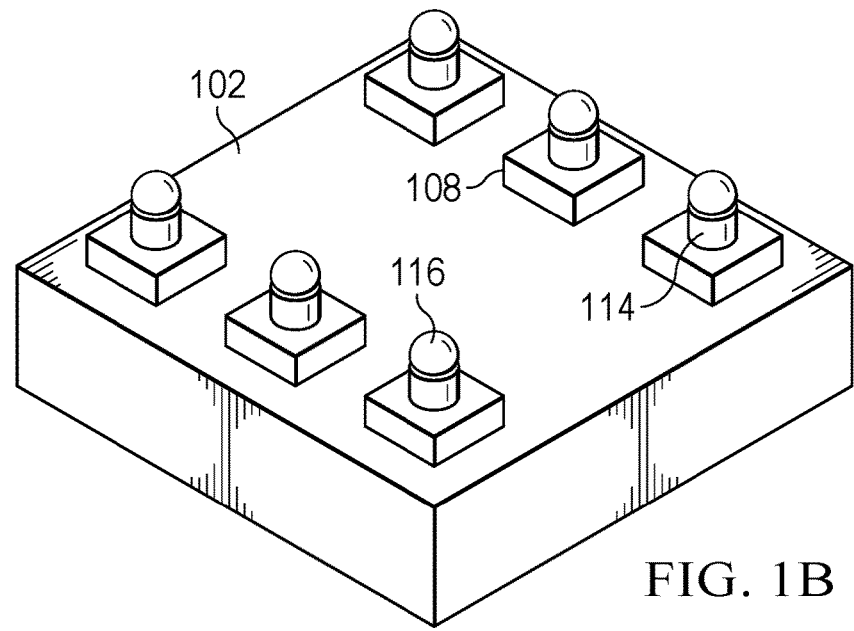

FIGS. 1A and 1B illustrate, in two projection views, a semiconductor wafer having semiconductor die devices formed on it and configured for flip chip mounting, and an individual semiconductor die for flip-chip mounting, respectively. In FIG. 1A, a semiconductor wafer 101 is shown with an array of semiconductor dies 102 formed in rows and columns on a surface. The semiconductor dies 102 can be formed using processes in a semiconductor manufacturing facility, including ion implantation, doping, anneals, oxidation, dielectric and metal deposition, photolithography, pattern, etch, chemical mechanical polishing (CMP), electroplating, and other processes for making semiconductor devices. Scribe lanes 103 and 104, which are perpendicular to one another, and which run in parallel groups across the wafer 101, separate the rows and columns of the completed semiconductor dies 102, and provide areas for dicing the wafer 101 to separate the semiconductor dies 102 from one another.

FIG. 1B illustrates a single semiconductor die 102 taken from semiconductor wafer 101. Semiconductor die 102 includes bond pads 108, which are conductive pads that are electrically coupled to devices (not shown) formed in the semiconductor die 102. Conductive post connects 114 are shown extending away from a proximate end on the bond pads 108 on the surface of semiconductor die 102 to a distal end, and solder bumps 116 are formed on the distal ends of the conductive post connects 114. The conductive post connects 114 can be formed by electroless plating or electroplating. In an example, the conductive post connects 114 are copper, and have solder bumps 116 on the distal ends, and are sometimes referred to as "copper pillar bumps." Copper pillar bumps can be formed by sputtering a seed layer over the surface of the semiconductor wafer 101, forming a photoresist layer over the seed layer, using photolithography to expose seed layer over the bond pads 108 in openings in the layer of photoresist, plating the copper conductive post connects 114 on the bond pads, and plating a lead solder or a lead-free solder such as an tin, silver (SnAg) or tin, silver, copper (SnAgCu) or SAC solder to form solder bumps 116 on the copper conductive post connects 114. In an alternative approach, solder bumps or particles may be dropped onto the distal ends of the copper pillar bumps and then reflowed in a thermal process to form bumps. Other conductive materials can be used for the conductive post connects in an electroplating or electroless plating operation, including gold, silver, nickel, palladium, or tin, for example. Not shown for clarity of illustration are under bump metallization (UBM) portions which can be formed over the bond pads 108 to improve plating and adhesion between the conductive post connects 114 and the bond pads 108. After the plating operations, the photoresist is then stripped, and the excess seed layer is etched from the surface of the wafer. Polyimide ("PI") (not shown) or other dielectric can be applied between the conductive post connects to protect the semiconductor die 102 and the conductive post connects 114. The semiconductor dies 102 are then separated by dicing, or are singulated, using the scribe lanes 103, 104 (see FIG. 1A).

Figure 2A:
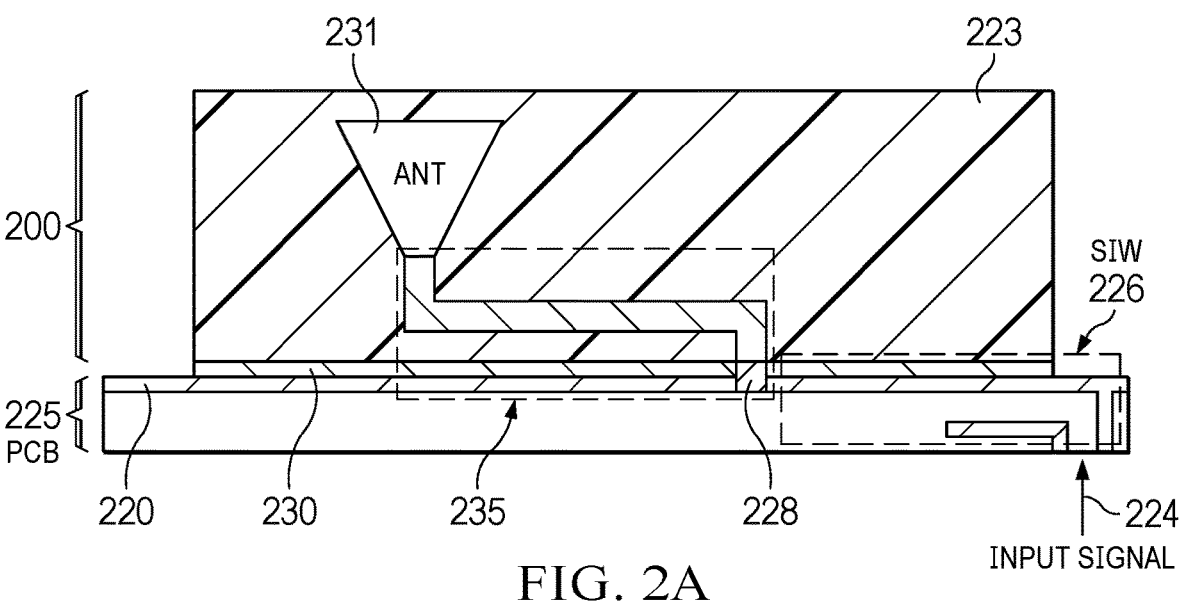
FIGS. 2A-2C illustrate, in cross-sectional views, microelectronic device packages including a waveguide transition to couple signals from an SIW waveguide to an antenna, from an SIW to a semiconductor device, and from an SIW to both an antenna and a semiconductor device, respectively, illustrating applications for example arrangements.
Figure 2B:
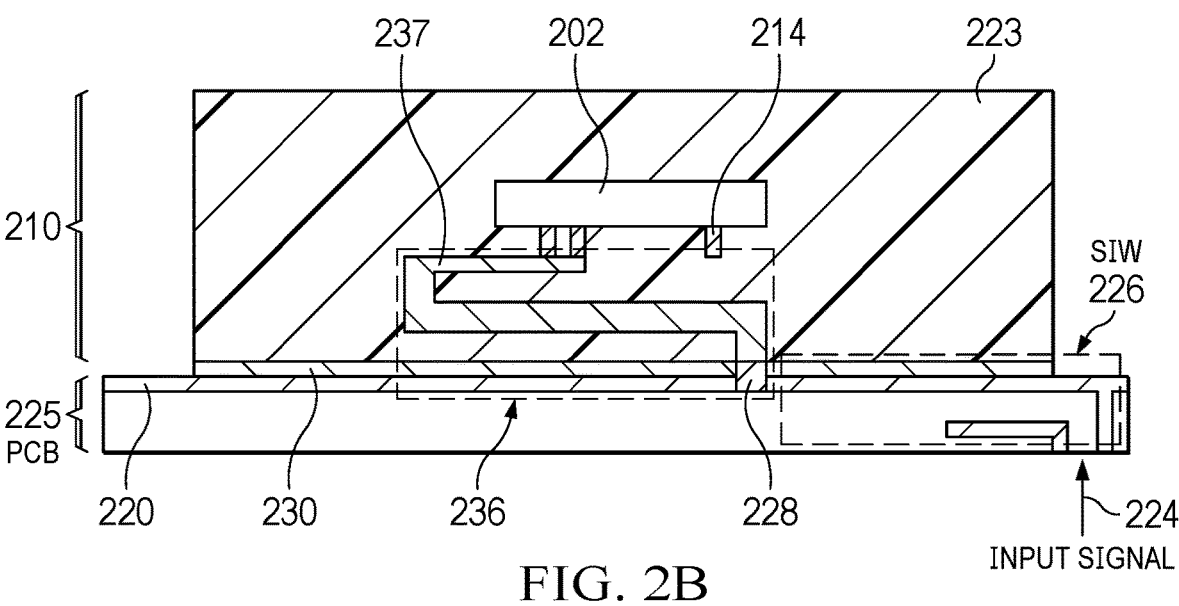
Figure 2C:
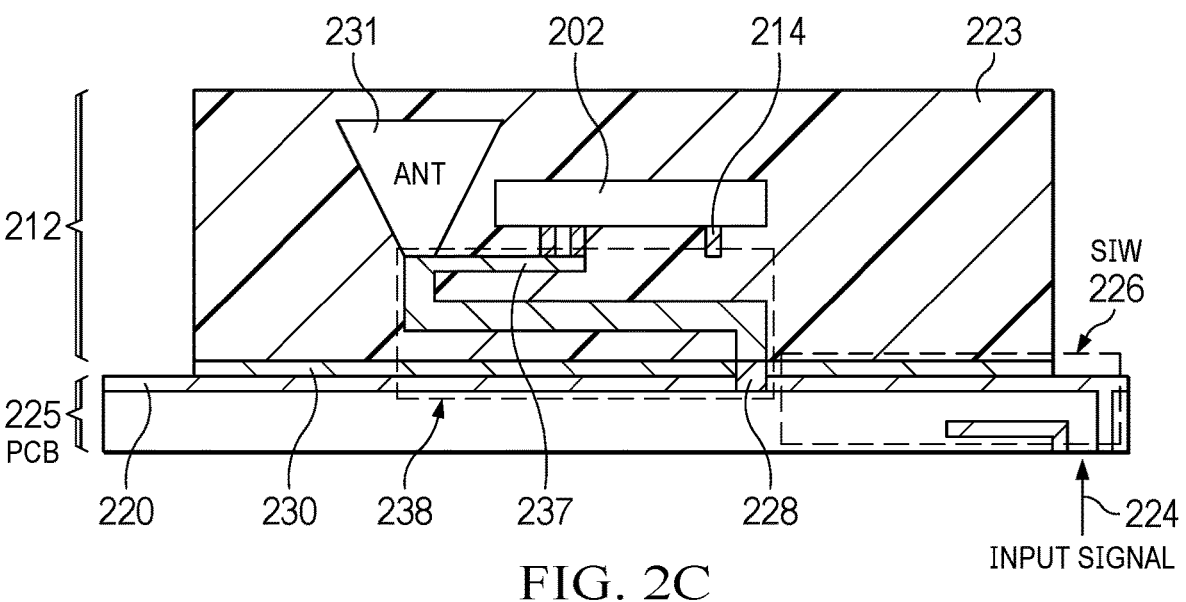

FIGS. 2A-2C illustrate, in three cross-sectional views, respectively, a microelectronic device package that can be used in example arrangements.

In FIG. 2A, a waveguide transition 235 is formed using a multilayer build-up package substrate and is integral to the microelectronic device package 200. In FIG. 2A, a PCB 225 includes a substrate integrated waveguide (SIW) 226 that receives an input signal 224, for example from another waveguide (not shown). The input signal can be a millimeter wave signal, a microwave signal, an RF signal or other frequency signal. In particular examples the input signal can be a WR5 frequency signal of between 140 GHz and 220 GHz. A ground plane 220 is formed on the PCB 225 as part of the SIW 226.

A pin 228 on the PCB 225 provides an input (or output) from the SIW 226. Solder 230 couples the pin 228 to an input port of the waveguide transition 235 in microelectronic device package 200. In the example arrangement of FIG. 2A, the microelectronic device package includes an antenna or antennas 231, labeled "ANT." In the arrangements, the antenna can have various shapes and types. The waveguide transition 235 can include a coplanar waveguide such as a grounded coplanar waveguide ("GCPW") on a device side surface that is then coupled to the antenna 231 or antennas.

FIG. 2B illustrates, in another cross-sectional view, an alternative arrangement. In FIG. 2B, a microelectronic device package 210 includes the waveguide transition 236 which receives a signal from the SIW 226 in PCB 225, using pin 228 which is coupled to the microelectronic device package 210 by solder 230. The microelectronic device package 210 has a waveguide transition 236 which can be formed using a multilayer build-up package substrate, and the waveguide transition 236 includes a coplanar waveguide 237 on a device side surface. The waveguide transition 236 couples the signal, which can be a millimeter wave, WR5, microwave, or radio frequency signal, from the SIW 226 in PCB 225 to a semiconductor die 202. Semiconductor die 202 is shown flip chip mounted to the device side surface of the waveguide transition 236 using post connects 214, (which are similar to post connects 114 in FIG. 1B). In this example arrangement, an antenna is not used. The semiconductor die 202 can be a transceiver, receiver or transmitter that provides the signals to or receives signals from the transition. In the example, an input signal 224 is input to the SIW from a source, which can be a microstrip or waveguide (not shown) coupled to the PCB 225.

FIG. 2C illustrates, in yet another cross-sectional view, an additional alternative arrangement. In FIG. 2C. a microelectronic device package 212 includes an integral waveguide transition 238, which can be formed in an arrangement using a multilayer build-up package substrate. In the example arrangement, microelectronic device package 212 includes both a semiconductor die 202, which is shown flip chip mounted to the device side of the waveguide transition 238, and an antenna 231 labeled "ANT." Mold compound 223 covers the semiconductor die 202, the antenna 231, and the waveguide transition 238, to form the body of the microelectronic device package 212. An input signal 224 is received by SIW 226 in PCB 225, the input signal can be a microwave, millimeter wave, WR5, or radio frequency signal. The coplanar waveguide 237 is formed as part of the waveguide transition 238 and trace conductors couple the antenna 232 to the semiconductor die 202. In an example application for this arrangement, the semiconductor die 202 can be a signal monitor or feedback device that receives and observes the signals at the antenna 231, to ensure correct operation of a system, to provide feedback for signal tuning or signal filtering, or to reconstruct modulated, compressed or encrypted signals to ensure correct data transmission/reception.

Figure 3A:
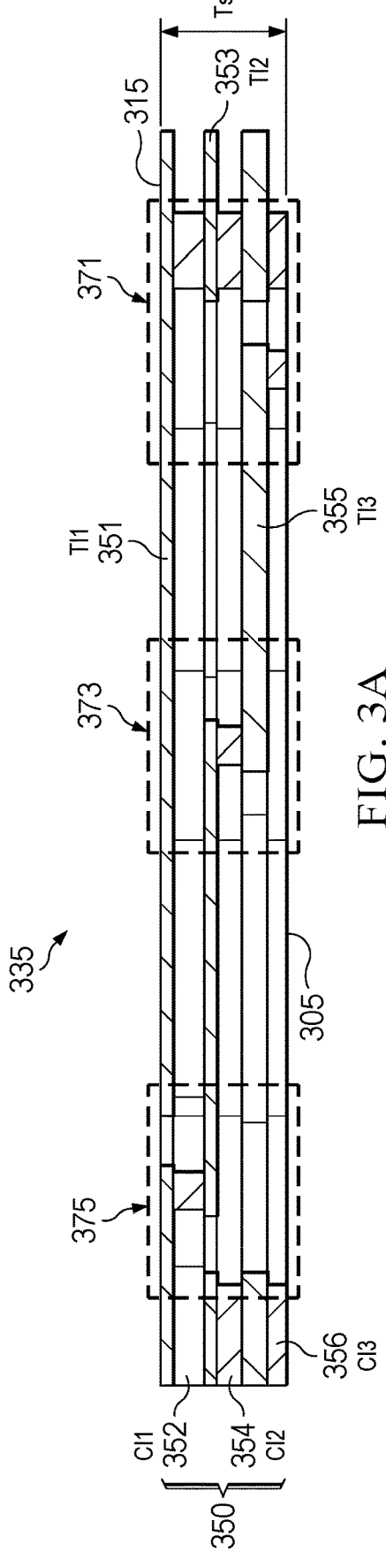
FIGS. 3A-3D illustrate, in a cross-sectional view and in three projection views, respectively, details of a waveguide transition of an arrangement formed in a multilayer build-up package substrate.

FIGS. 3A-3D illustrate, in a cross-sectional view and in three projection views, respectively, details of a waveguide transition 335 of an arrangement formed in a multilayer build-up package substrate. In FIG. 3A, the waveguide transition 335 is shown formed using a multilayer build-up package substrate 350 with a thickness "Ts", which can be in an example about 200 microns, although the substrate thickness Ts can vary. The multilayer build-up package substrate 350 can be formed using an additive manufacturing process to form alternating layers of plated conductors in a dielectric material. In FIG. 3A, the example multilayer build-up package substrate 350 includes three trace conductor layers 351, 353, 355 (labeled "Tl1", "Tl2", and "TL3" in FIG. 3A) which can be connected vertically by the three connection conductor layers (labeled "Cl1", "Cl2", and "Cl3" in FIG. 3A) 352, 354, 356. Note that the illustration in FIG. 3A does not show dielectric material, for simplicity of illustration, but the trace conductor layers and the connection conductor layers will be patterned and surrounded by dielectric material to isolate layers from one another and to fill open spaces in the patterned conductor layers. Because the conductors are formed in a repeated additive plating process, as is explained in detail with respect to FIGS. 4A-4B below, the connection conductor layers can be formed in any shape, and the trace conductor layers can also be formed in any shape. This feature of the arrangements allows the multilayer build-up package substrate to have connection conductor layers patterned to form "via shaped portion" connections, that is circular shaped portions of the connection conductor layers that connect the trace conductor layers vertically through the dielectric material, but the connection conductor layers can also be patterned to be stacked with the trace conductor layers in various shapes to form rails, pads, shields or walls of conductor material that extend vertically through the multilayer build-up package substrate.

Of particular importance for the waveguide transitions of the arrangements, ground planes spaced from the via shaped portions, striplines or coplanar waveguides can be formed. Also, the via shaped portions formed in the connection conductor layers and the pad connection shapes formed in the trace conductor layers to contact the via shaped portions can be of arbitrary size, increasing the design freedom (when compared to through-hole vias formed using PCB technology, which are drilled as holes in rigid dielectric material and then filled, limiting the sizes that can be used.) In example arrangements, the multilayer build-up package substrate 350 is used to form multiple sub-transitions shown as 371, 373, and 375 in FIG. 3A. At least two sub-transitions are used, while in the illustrated arrangements, three sub-transitions are used. As is further described below, these sub-transitions can be individually tuned and impedance matching can be performed to increase performance and reduce signal loss in the waveguide transition 335 (when compared to a transition device formed without the use of the arrangements). While the example multilayer build-up package substrate 350 shown in FIG. 3A has three trace conductor layers, and three connection conductor layers, the number of conductor layers used can be more, or fewer.

In one example the multilayer build-up package substrate 350 has a substrate thickness labeled "Ts" of about 200 microns. In this example, the first trace conductor layer, 351, is near or at the device side surface 315 of the multilayer build-up package substrate 350, and has a first trace conductor layer thickness of about 20 microns, with a range from 10-30 microns. The first connection conductor layer, 352, has a thickness of about 45 microns. The second trace conductor layer, 353, sometimes coupled to the first trace conductor layer by portions of the first connection conductor layer 352, has a thickness of about 20 microns, with a range from 10-30 microns. The second connection conductor layer, 354, has a thickness of about 45 microns. The third trace conductor layer, 355, has a thickness of about microns with a range from 25-45 microns, and the third connection conductor layer, 356, has a thickness of about 35 microns. Additional layers, such as conductive lands on the device side surface 315, or conductive terminals on the board side surface 305, may be formed by additional plating (not shown in FIG. 3A). The thicknesses of the conductor layers can vary and may vary due to manufacturing tolerances.

When the multilayer build-up package substrate 350 is formed, a continuous connection between the device side surface 315 and the board side surface 305 can be formed by patterning a stack of trace conductor layers and by patterning the corresponding connection conductor layers to form a vertically continuous path extending through the multilayer build-up package substrate.

Note that in this description, the connection conductor layers 352, 354, and 356 are not described as "vias." This is done to distinguish the connection conductor layers of the arrangements from vertical connections of PCBs or other circuit board substrates, where vias are filled or plated through holes. In this description when a vertical connection that is circular and connects trace conductor layers is formed using a connection conductor layer, it is described as a "via shaped portion." This is to clarify that other shapes can be formed from the same connection conductor layer, such as ground planes. While the arrangements are illustrated with asymmetric striplines, note that symmetric striplines can also be used.

Figure 3B:
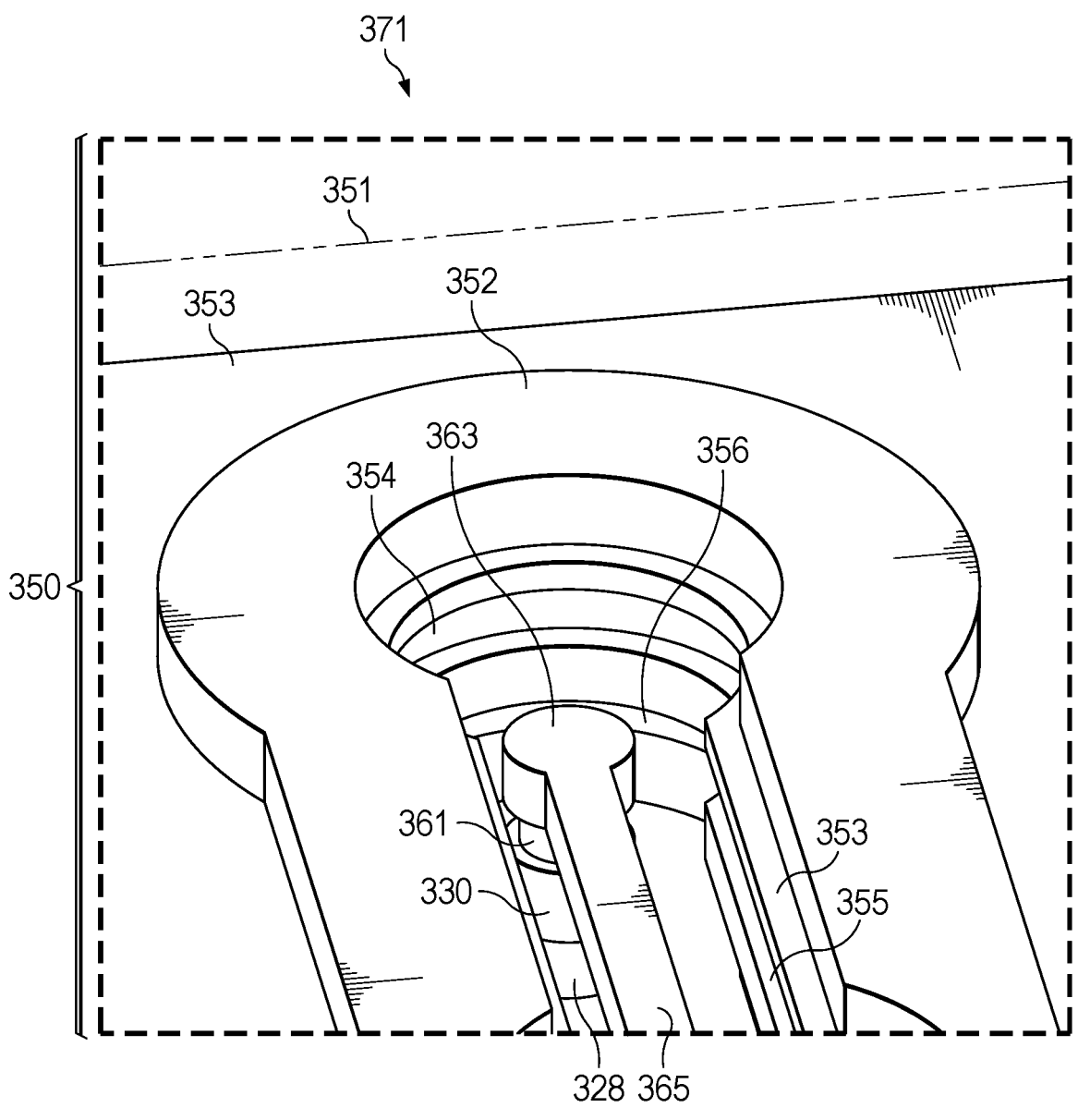

FIG. 3B illustrates, in a detailed projection view, example sub-transition 371, which forms a first sub-transition, with sub-transition 373 forming a second sub-transition, and sub-transition 375 forming a third sub-transition in this example. The sub-transition 371 makes a transition from an input port at a board side surface 305 of the waveguide transition 335 to a lower asymmetric stripline 365, the lower asymmetric stripline 365 formed in the trace conductor layer 355. The sub-transition 371 includes portions of the trace conductor layers 351, 353, and 355 (used for lower asymmetric stripline 365 and for asymmetric stripline pad connection 363). The sub-transition 371 further includes connection layers 352, 354 and 356 (used for a via shaped portion 361 that is configured to be soldered to a board). The via shaped portion 361 is on a board side surface of the multilayer build-up package substrate 350 and as shown in FIG. 3B, can be coupled to a signal pin 328 on a PCB by solder 330. Note that the signal pin 328 is part of the PCB and is not part of the sub-transition, it is coupled to the first sub-transition 371 by solder 330. The first sub-transition 371 receives a signal, such as a millimeter wave signal, on via shaped portion 361 that is patterned in the connection layer 356 on the board side surface of the multilayer build-up package substrate 350. As shown in FIG. 3B, the sub-transition 371 couples the signal from the via shaped portion 361 to a lower asymmetric stripline connection pad connection 363, which is formed of the trace conductor layer 355. The lower asymmetric stripline 365 extends from the asymmetric stripline pad connection 363 and carries the signal from the sub-transition 371. The sub-transition 371 has an opening in the conductor layers 356, 355, 354, 353, and 352 that surrounds the via shaped portion 361 and the asymmetric stripline connector pad 363, and is spaced from it. Ground connections can be used to form ground planes of the conductor layers surrounding the asymmetric stripline connector pad 363 and extending along and spaced from the lower asymmetric stripline 365. As is further described below, the spacing between the elements, and the diameters of the via shaped portion 361, which acts as a vertical connector coupled to the asymmetric stripline connector pad 363, can be used as tuning elements to cancel capacitance and inductance of the elements, and to tune the sub-transition 371 to create a low impedance, low loss circuit for a frequency of interest.

Figure 3C:
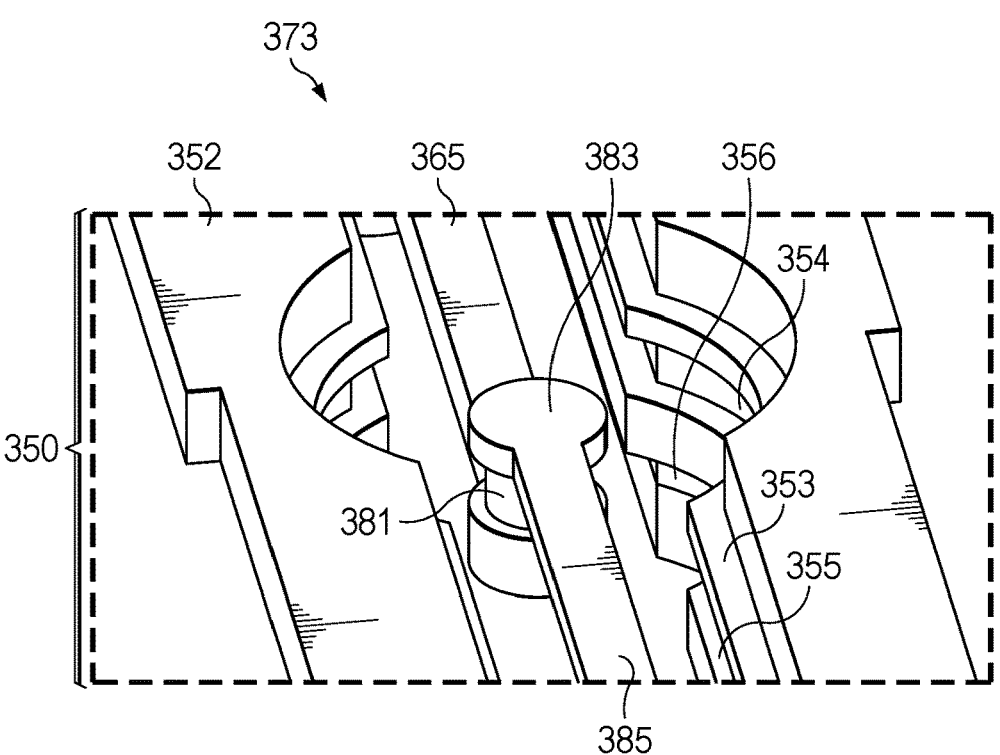

Referring again to FIG. 3A, the next sub-transition in the path from the input of the transition 335 to the device side surface is the second sub-transition 373. FIG. 3C illustrates an example sub-transition 373 in a projection view.

In FIG. 3C, sub-transition 373 is coupled to the lower asymmetric stripline 365 extending from the sub-transition 371, and couples to a second asymmetric stripline, an upper asymmetric stripline 385. Sub-transition 373 is therefore a stripline-to-stripline transition. Referring again to FIG. 3A, it can be seen that in waveguide transition 335, sub-transition 373 is laterally spaced from sub-transition 371. As shown in FIG. 3C, sub-transition 373 includes a via shaped portion 381 formed in the connection layer 354, and an asymmetric stripline pad connection 383 formed in the trace conductor layer 353. The upper asymmetric stripline 385 extends from the sub-transition 373 in a direction opposite the lower asymmetric stripline 365. The via shaped portion 381 and the asymmetric stripline pad connection 383 are in an opening and spaced from ground planes that are formed in layers 354, 353, 352. The upper asymmetric stripline 385 is also spaced from ground planes in the conductor layers as it extends from the sub-transition 373.

Figure 3D:
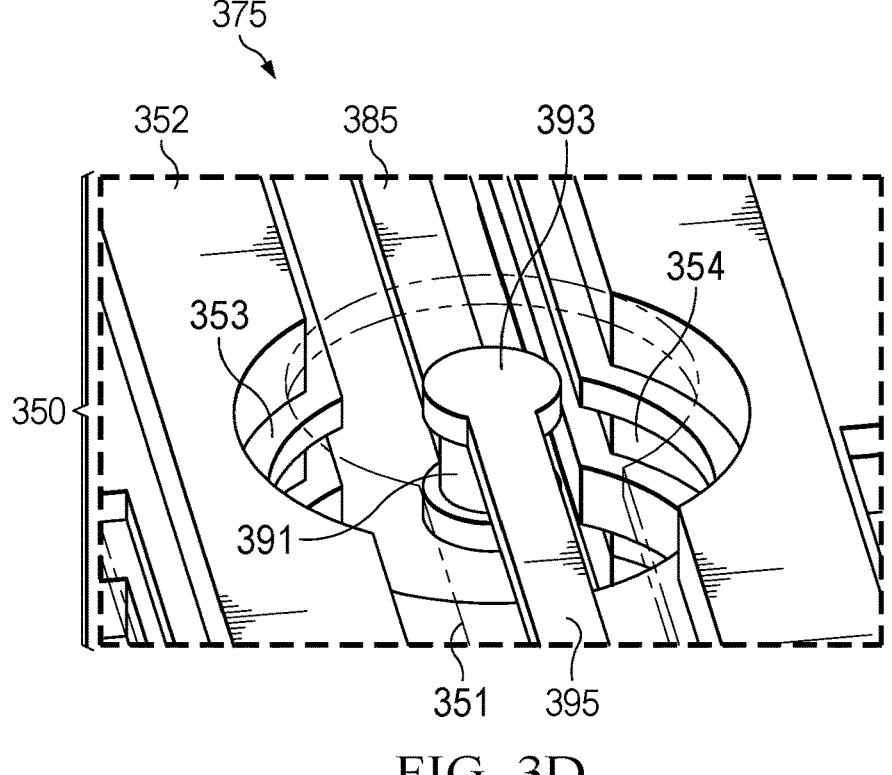

FIG. 3D illustrates in a projection view the third sub-transition 375, which as shown in FIG. 3A, is formed of conductors of the multilayer build-up package substrate 350. The third sub-transition 375 couples the upper asymmetric stripline 385 to a coplanar waveguide 395. The coplanar waveguide 395 is on a device side surface of the waveguide transition (see 335 in FIG. 3A). The third sub-transition 375 is formed in the upper conductor layers of the multilayer build-up package substrate 350, and the coplanar waveguide 395 couples the signals to the device side surface of the waveguide transition 335. The connection conductor layer 352 is patterned to form the via shaped portion 391 to connect the upper asymmetric stripline 385, formed in the trace conductor layer 355 (see FIG. 3C), to the coplanar waveguide 395 at the pad connection 393. The coplanar waveguide 395 can be used to form a grounded coplanar waveguide (GCPW) by forming ground planes in the conductors beneath the coplanar waveguide 395.

Figure 4A:
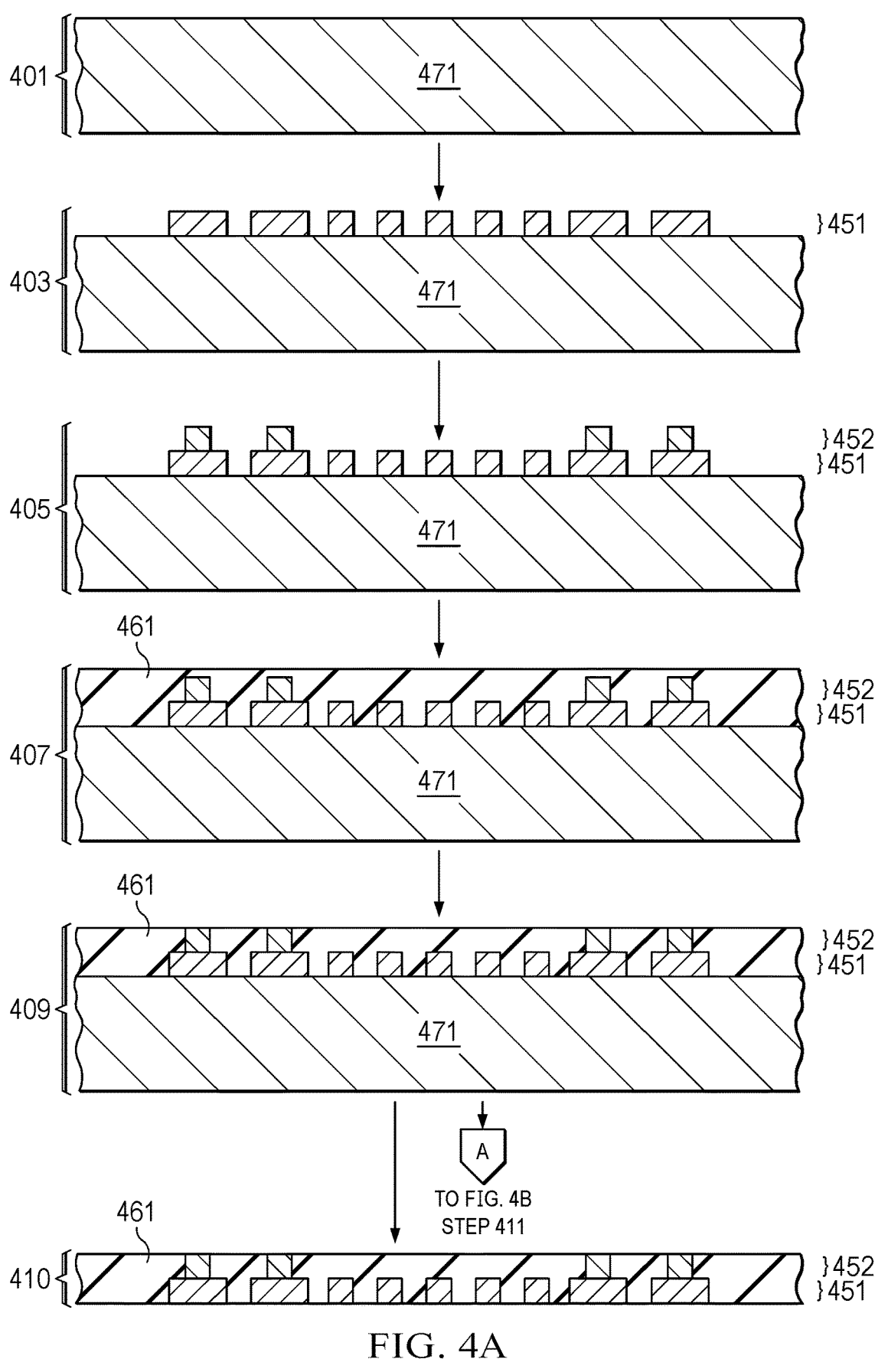
Figure 4B:
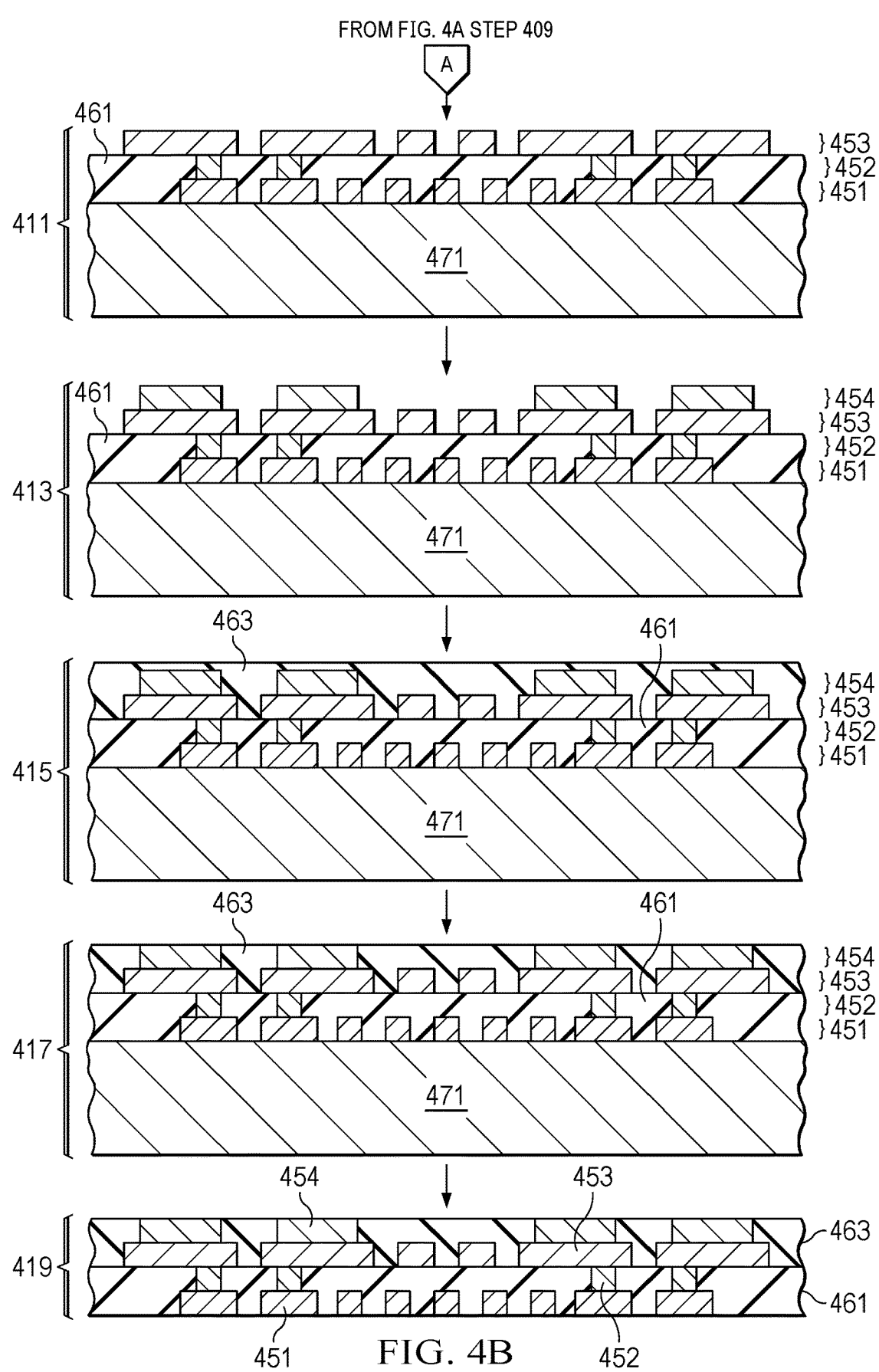

FIGS. 4A-4B illustrate, in a series of cross-sectional views, selected steps for a method for forming a multilayer build-up package substrate, such as the multilayer build-up package substrate 350 in FIG. 3A, that is useful with the arrangements. Note that in FIGS. 4A-4B, two trace conductor layers, and two connection conductor layers, are shown for purposes of explanation, however in the illustrated example waveguide transitions of the arrangements three trace conductor layers, and three connection conductor layers, are used. Additional conductor layers can be formed using the additive manufacturing or build-up process.

In FIG. 4A, at step 401, a metal, semiconductor or glass carrier 471 is readied for a plating process. The carrier 471 can be stainless steel, steel, aluminum or another metal or can be a silicon wafer or a glass that will support the multilayer package substrate layers during plating and molding steps, the multilayer package substrate is then removed, and the carrier 471 can be discarded or can be cleaned for use in additional manufacturing processes.

At step 403, a first trace conductor layer 451 is formed by plating. In an example process, a seed layer is deposited over the surface of carrier 471, by sputtering, chemical vapor deposition (CVD) or other deposition step. A photoresist layer is deposited over the seed layer, exposed, developed and cured to form a pattern to be plated. Electroless or electroplating is performed using the exposed portions of the seed layer to start the plating, forming a pattern according to patterns in the photoresist layer. The conductor layers can be plated of copper, gold, aluminum, silver or an alloy thereof. In an example, copper is used.

At step 405, the plating process continues. A second photoresist layer is deposited, exposed, and developed to pattern the first connection conductor layer 452. By leaving the first photoresist layer in place, the second photoresist layer is used without an intervening photoresist strip and clean step, to simplify processing. The first trace conductor layer 451 can be used as a seed layer for the second plating operation, to further simplify processing, as another sputter process is not performed at this step.

At step 407, a first dielectric material is deposited. The first trace conductor layer 451 and the first connection conductor layer 452 are covered in a dielectric material 461. In an example, a thermosetting resin material is used, in a particular example Ajinomoto build-up film ("ABF") is used. ABF is commercially available from Ajinomoto Co. Inc., Tokyo, Japan. In alternative examples acrylonitrile butadiene styrene (ABS), acrylonitrile styrene acrylate (ASA), or resin epoxy mold compound can be used; resins, epoxies, or plastics can be used. In an example dielectric deposition process using ABF, roll ABF film is used. The ABF film is laminated over the trace conductor layer 451 and the connection conductor layer 453, and in a thermal process at an elevated temperature and using vacuum, the ABF film softens and conforms to the conductor layers to fill the spaces with dielectric, without voids. The dielectric layer 461 can then be cured to harden the material for successive processes.

At step 409, a grinding operation is performed on the surface of the dielectric layer 461 that exposes a surface of the connection conductor layer 452 and provides conductive surfaces for mounting devices, or for use in additional plating operations. If the multilayer build-up package substrate is complete at this step, the method ends at step 410, where a de-carrier operation removes the carrier 471 from the dielectric material 461, leaving the first trace conductor layer 451 and the first connection conductor layer 452 in a dielectric material 461, providing a multilayer build-up package substrate.

In examples where additional trace conductor layers and additional connection conductor layers are needed, the method continues, leaving step 409 and transitioning to step 411 in FIG. 4B. The multilayer build-up package substrate is now shown supported on carrier 471 with first trace conductor layer 451 and connection conductor layer 452 in dielectric 461. For example, in the illustrated arrangements, three trace conductor layers, and three connection conductor layers, are used. More or fewer layers can be used to form additional arrangements.

At step 411, a second trace conductor layer 453 is formed by plating using the same processes as described above with respect to step 405. An additional seed layer for the additional plating operation is deposited and a photoresist layer is deposited and patterned, and the plating operation forms the second trace conductor layer 453 over the dielectric 461, with portions of the second trace conductor layer 453 electrically connected to the first connection conductor layer 452.

At step 413, a second connection conductor layer 454 is formed using an additional plating step on the second trace conductor layer 453. The second connection conductor layer 454 can be plated using the second trace conductor layer 453 as a seed layer, and without the need for removing the preceding photoresist layer, simplifying the process. Alternatively, additional seed layer deposition can be performed.

At step 415, a second dielectric deposition operation is performed to cover the second trace conductor layer 453 and the second connection conductor layer 454 in a layer of dielectric 463. The multilayer build-up package substrate at this stage has a first trace conductor layer 451, a first connection conductor layer 452, a second trace conductor layer 453, and a second connection conductor layer 454, portions of the conductors are electrically connected together to form conductive paths through the dielectric layers 461 and 463.

At step 417, the dielectric 463 is mechanically ground in a grinding process or is chemically etched to expose a surface of the second connection conductor layer 454. At step 419 the example method ends by removing the carrier 471, leaving a multilayer build-up package substrate including the trace conductor layers 451, 453, and connection conductor layers 452 and 454 in dielectric layers 461, 463. The steps of FIGS. 4A-4B can be repeated to form multilayer build-up package substrates for use with the arrangements having more layers, by performing plating of a trace conductor layer, plating of a connection conductor layer, adding a dielectric material covering the conductor layers, and grinding, repeatedly. For example, the multilayer build-up package substrate 350 (see FIG. 3A) has three conductor layers, and three connection layers.

Useful sizes for an example of the multilayer build-up package substrate could be from two to seven millimeters wide by two to seven millimeters long, for example. The size of the multilayer build-up package substrate can be varied depending on the size and number of semiconductor devices mounted, if any, as well as the size and number of antennas and their dimensions, if any are included, so that the area of the device side surface is sufficient for mounting the semiconductor devices, if used, and for forming the antennas if used.

As signal frequencies increase, the wavelengths of the signals become smaller and become compatible with microelectronic device package sizes. For example millimeter wave signals between 30 GHz and 300 GHz have wavelengths of between 10 and 1 millimeters. The arrangements take advantage of these wavelengths to form integral waveguide transitions sized compatibly for microelectronic device packages. As the transmit and receive frequencies increase and the signal wavelengths correspondingly decrease, the size of the antennas may also decrease, and the useful sizes of the multilayer build-up package substrate may also decrease. The arrangements are useful in implementing antennas with millimeter wave frequencies, radar frequencies, WR5, and 5G standard frequencies, for example. Future developments in communications may use higher frequency signals, with correspondingly smaller wavelengths, allowing the integral waveguide transitions of the arrangements to be smaller still.

Figure 5A:
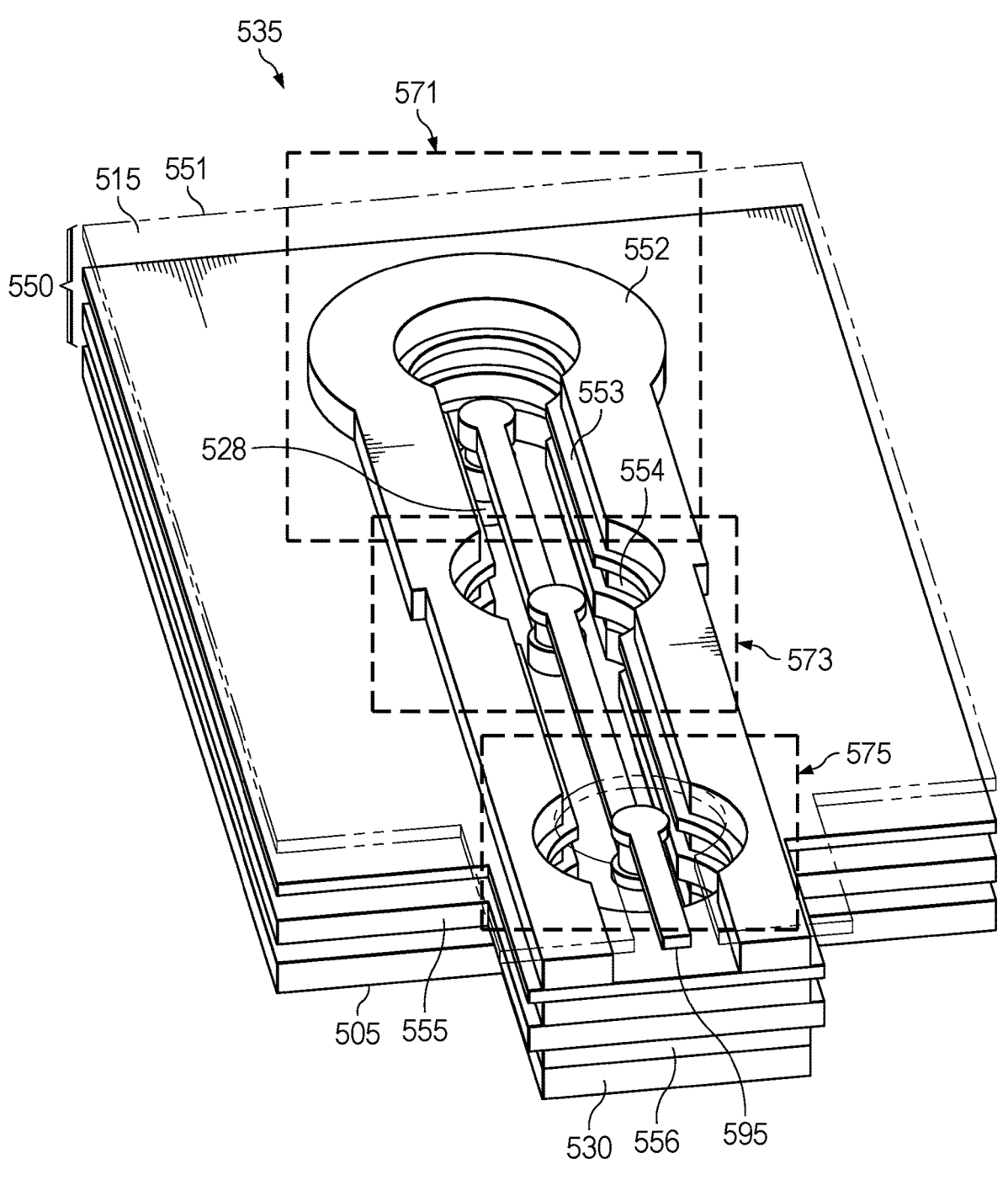
FIGS. 5A-5D illustrate, in projection views, details of a particular example waveguide transition formed using the arrangements.
Figure 5B:
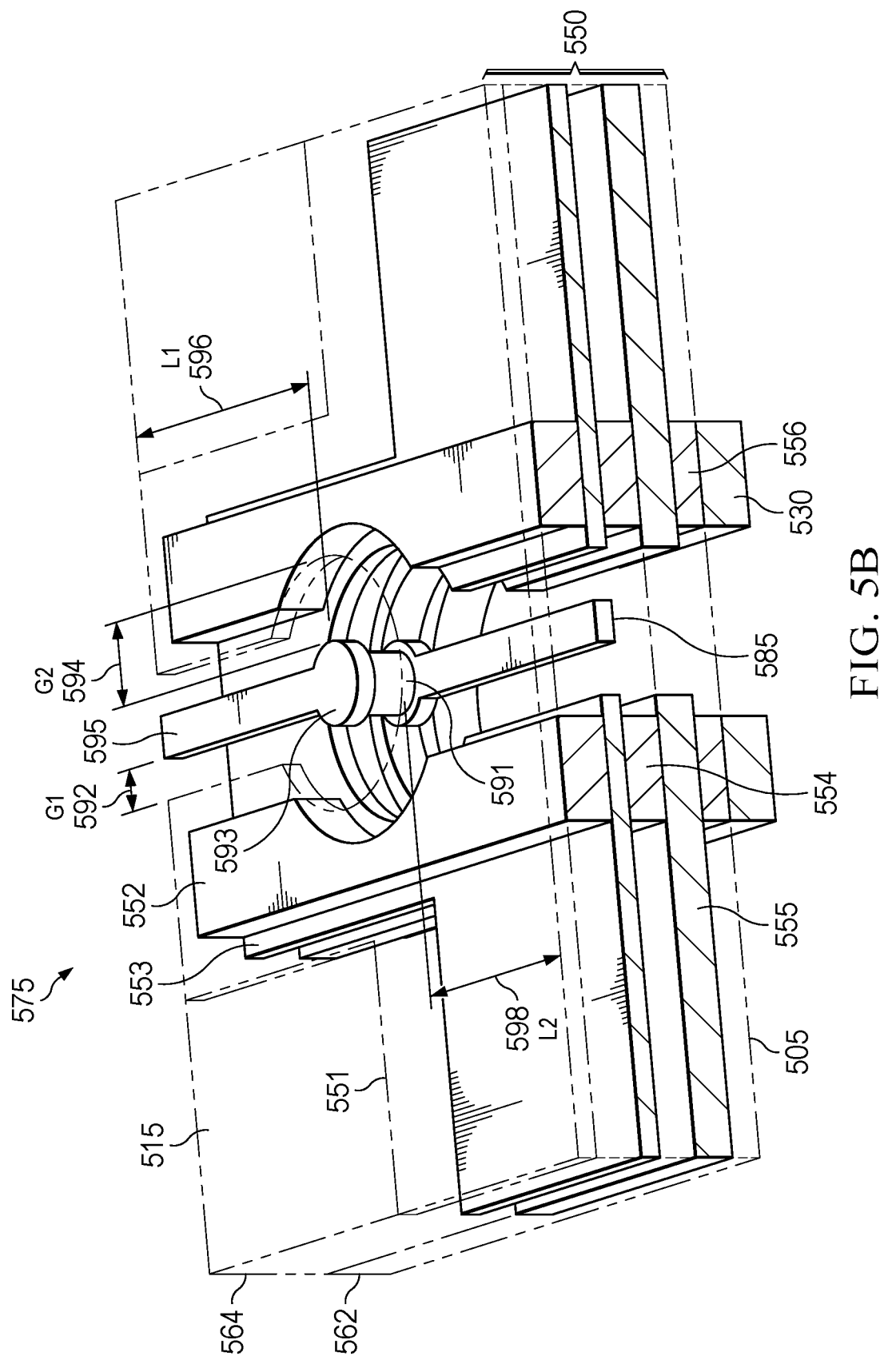
Figure 5B:
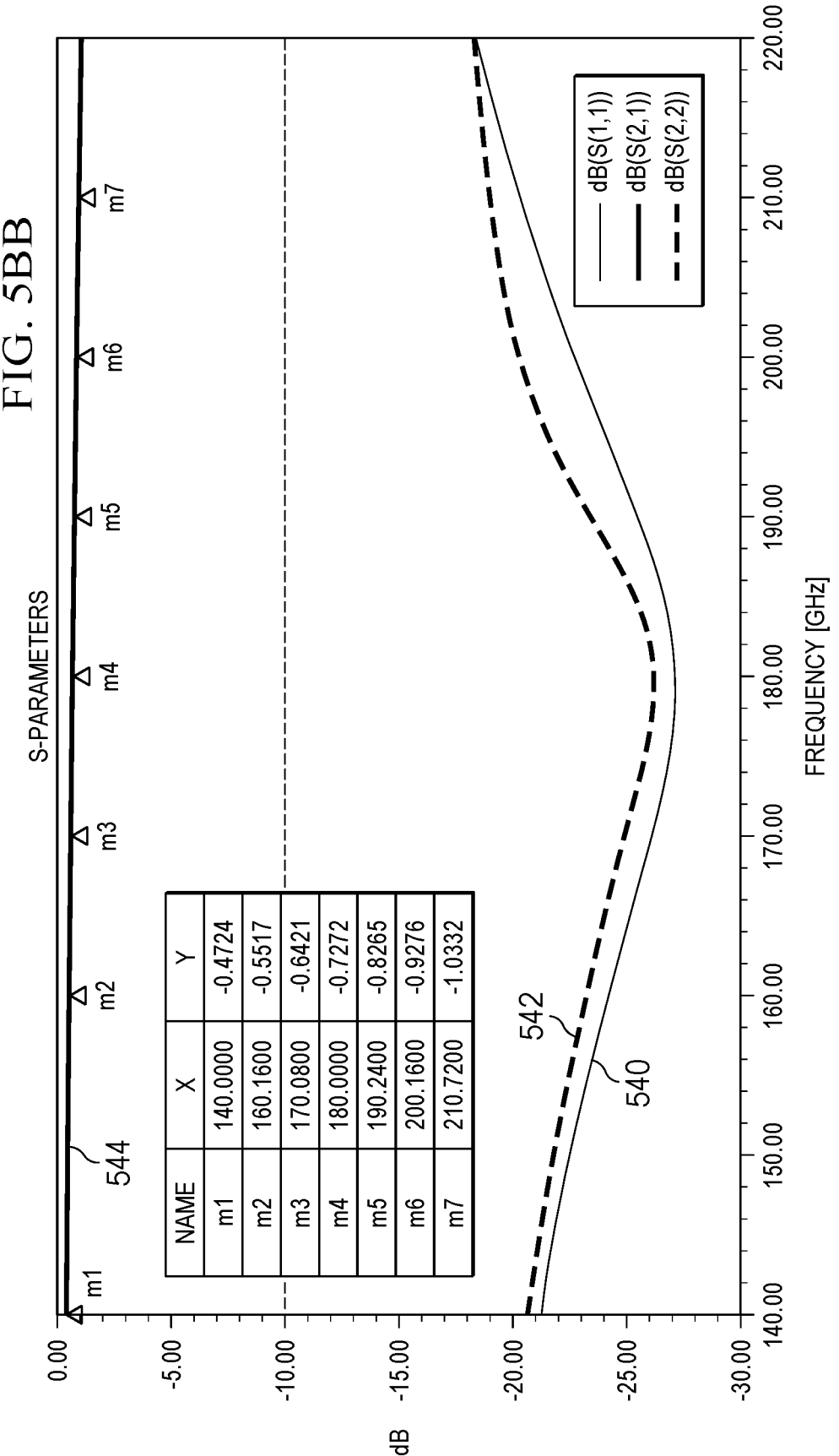

FIGS. 5A-5D illustrate, in projection views, details of a particular example waveguide transition formed using the arrangements. FIGS. 5BB, 5CC, and FIG. 5DD illustrate S-parameter graphs for sub-transitions shown in FIGS. 5B, 5C and FIG. 5D, respectively. FIG. 5E illustrates in a cross-sectional view the multilayer build-up package substrate used to form the waveguide transition of FIG. and FIG. 5EE illustrates, in another S-parameter graph, a simulation result for the waveguide transition of FIG. 5A. FIG. 5F illustrates in another cross-sectional view, a microelectronic device package including the waveguide transition of FIG.

In FIG. 5A, a projection view of an example waveguide transition 535 is shown. This example waveguide transition is arranged for a particular frequency range, the WR5 frequency range, of between 140 GHz and 220 GHz. Other frequencies can be used by changing parameters, as is described below, to tune the device for the particular signals being carried by the waveguide transition 535.

In the arrangement shown in FIGS. 5A-5F and the description herein, asymmetric striplines are shown and described. However, symmetric striplines can be used as alternatives to the asymmetric striplines to form the sub-transitions shown, for example.

In FIG. 5A, the waveguide transition 535 is shown looking from a coplanar waveguide end towards a PCB input end, a coplanar waveguide 595 is shown at the front of FIG. 5A, closer to the viewer, and a PCB input pin 528 is shown at the rear of FIG. 5A, farther from the viewer. In operation, the waveguide transition 535 couples the signal from an input pin 528 (on a system board or module beneath the waveguide transition 535) to the coplanar waveguide 595. In the similar manner as for the waveguide transition 335 in FIG. 3A, the waveguide transition 535 is shown formed with three sub-transitions, a first sub-transition 571, a second sub-transition 573, and a third sub-transition 575, which are further detailed in projection views of FIGS. 5A, FIG. 5B and FIG. 5C.

FIG. 5A illustrates the multilayer build-up package substrate 550 which includes trace conductor layers 551, 553 and 555, which are spaced from one another by dielectric material (not shown for simplicity of illustration). In an example, the conductor layers are copper or copper alloy, and the dielectric material can be ABF. Other materials can be used. Connection conductor layers 552, 554 and 556 are shown formed between and connecting portions of the trace conductor layers. By forming stacked conductor layers using the connection conductor layers and the trace conductor layers, ground planes can be built alongside, above, or beneath, the trace conductors that form striplines, or coplanar waveguides, in the waveguide transition 535. Solder 530 is shown beneath the board side surface 505 of the waveguide transition 535. The waveguide transition 535 can be integrated into a microelectronic device package (see, for example, waveguide transition 235 in microelectronic device package 200 in FIG. 2A, and see FIG. 5F described below.) The microelectronic device package can be mounted to a PCB or other substrate using solder 530, which will contact the input pin 528 an input port of the waveguide transition 535.

In the arrangements, the sub-transitions 571, 573, 575 in FIG. 5A are designed to act as quarter-wave transformers to provide an impedance match to the signal as it traverses the waveguide transition 535 through the successive sub-transitions. In the illustrated example, the via shaped portions of the connection conductor layers placed at pad connections on the trace conductor layers are formed at 55 microns in diameter, in an example process. The individual sub-transitions are designed to cancel the via pad capacitance and via inductances using gap adjustments between the elements and the ground planes formed in the sub-transitions. This is demonstrated in FIGS. 5B-5D for the sub-transitions 571, 573 and 575, respectively.

In the example arrangement illustrated in FIGS. 5A-5D, the sub-transitions are designed for a target frequency within the WR5 band of 196 GHz. In an alternative approach, the sub-transitions could be designed for frequencies at either end of a desired band and simulations used, with additional modifications of spacings of the elements, to assure the bandwidth needed is achieved, and the designs can be modified to increase the bandwidth.

FIG. 5B illustrates, in a close-up projection view, the third sub-transition 575 of FIG. 5A, which is a sub-transition from the upper asymmetric stripline to the coplanar waveguide, which carries the signals at the device side surface of the waveguide transition 535 (see device side surface 515 in FIG. 5A). In FIG. 5B, the view is starting from the upper asymmetric stripline 585 at the front of the projection, with the coplanar waveguide 595 extending to the away from the viewer.) Note that the view illustrated in FIG. 5B is taken in a direction opposite from the direction of the view in FIG. 5A.)

In FIG. 5B, the trace conductor layers 551, 553, 555 and the connection conductor layers 552, 554, and 556 are patterned to form the coplanar waveguide 595 (in trace conductor layer 551, at the device side surface 515 of the sub-transition 575); and the upper asymmetric stripline 585 (patterned in trace conductor layer 553). A via shaped portion 591 connects the upper asymmetric stripline 585 to the coplanar waveguide 595 at the pad connection 593 at one end of the coplanar waveguide 595. The via shaped portion 591 has a diameter, in this example, of about microns, which is a diameter the additive build-up process makes available.

The spacing of the elements in the example sub-transition is chosen to make a low impedance, low loss sub-transition. The spacing 592, the coplanar waveguide gap between the coplanar waveguide 595 and the associated ground planes, labeled "G1", was chosen at 49 microns. The spacing 594, between the pad connection 593 on the coplanar waveguide 595 and the surrounding ground planes, labeled "G2", was chosen at 95 microns. These spacings are determined for a target frequency using simulations to confirm that the impedance of the sub-transition 575 is well matched. The conductors of the multilayer build-up package substrate 550 are shown surrounded by dielectric materials 564, 562. These dielectric materials may be of Ajinomoto build-up film (ABF), acrylonitrile butadiene styrene (ABS), acrylonitrile styrene acrylate (ASA), or resin epoxy, for example. Mold compound can be used. The coplanar waveguide 595, which will be a grounded coplanar waveguide (GCPW) in this example, has a length 596, labeled "L1" in FIG. 5B, which was selected as 300 microns. Similarly, the upper asymmetric stripline 585, which extends towards the viewer, has a length 598, labeled "L2" which was selected at 300 microns. These distances and the spacings are chosen based on the materials, the thicknesses, and the frequencies of interest using simulations to confirm the performance of the sub-transition 575.

FIG. 5BB illustrates, in an S-parameter logarithmic graph, results obtained from simulations of the sub-transition 575. In FIG. 5BB, the curve 540 illustrates the S (1,1) parameter result, indicating the reflection loss from one side of the sub-transition, the curve 542 illustrates the S (2,2) parameter result, indicating the reflection loss from the opposite side of the sub-transition 575, and the curve 544 illustrates the S (2, 1) result, indicating the attenuation from one side to the other side of the sub-transition (forward gain). The frequency band illustrated in FIG. 5BB is the WR5 range, that is from 140 GHz to 220 GHz. The curve 542, the S (1,1) parameter curve, indicates the reflection loss is well below the −10 dB line, and is below −20 dB for the entire frequency band. Similarly, the curve 544, the S (2,2) parameter curve, is also below −20 dB for the entire frequency band. The curve 546, the attenuation or forward gain, is less than −1 dB across the range. The sub-transition 575 is therefore a low impedance, well matched element.

Figure 5C:
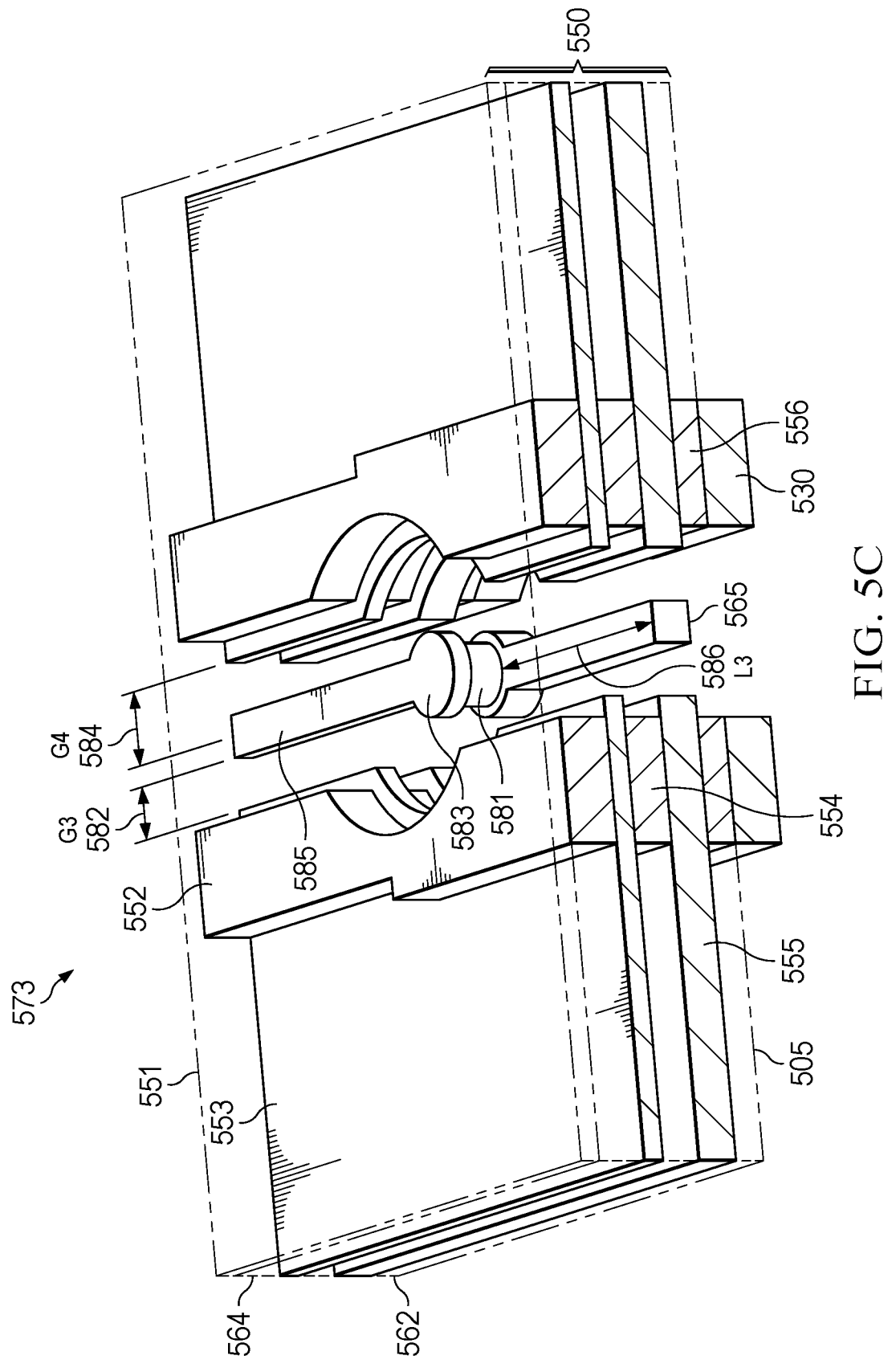
Figure 5C:
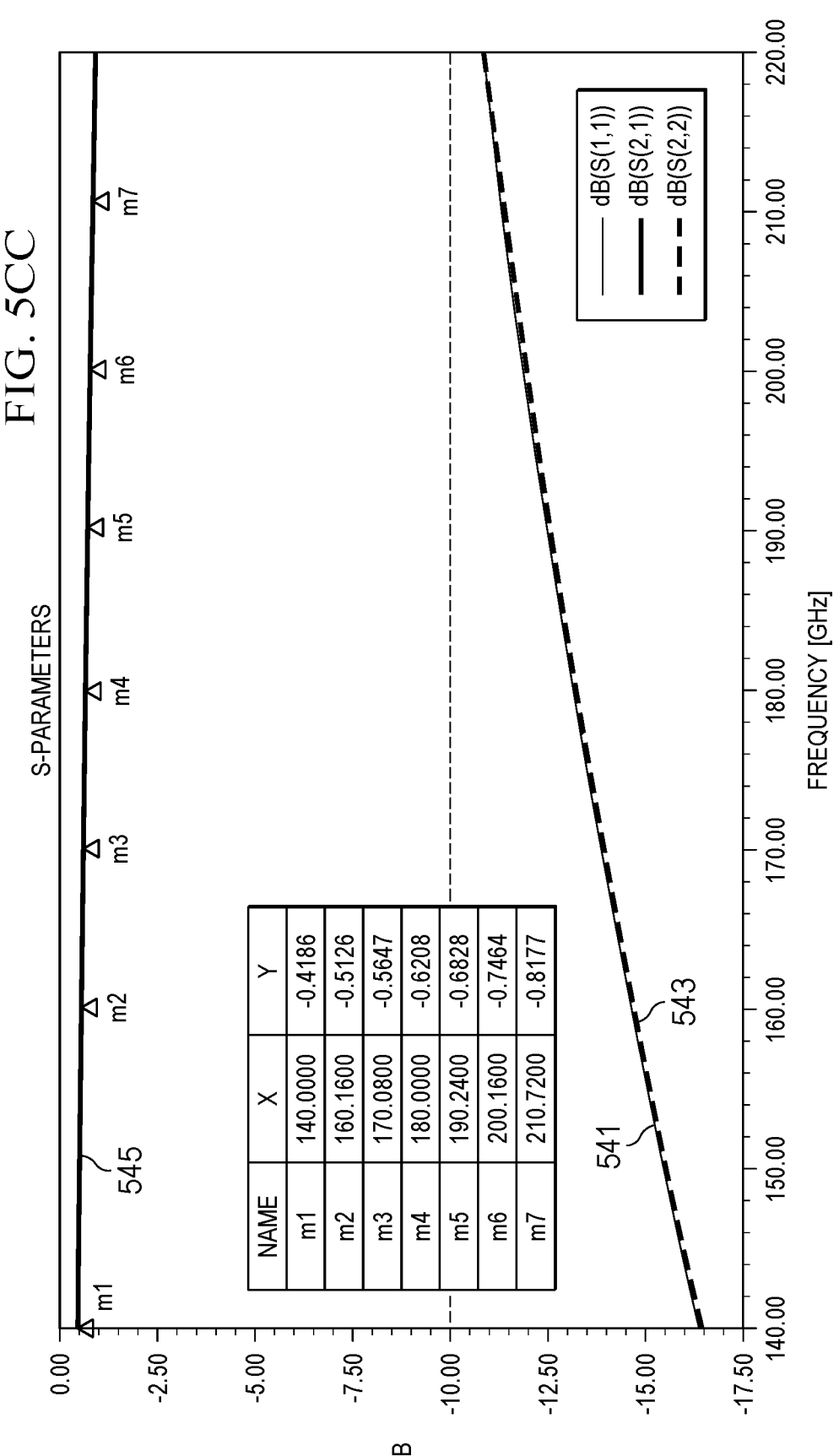

FIG. 5C illustrates, in a close-up projection view, the details of the middle sub-transition in FIG. 5A, that is the second sub-transition 573. The sub-transition 573 couples the upper asymmetric stripline 585 (see FIG. 5B) to a lower asymmetric stripline 565, that is the transition 573 is a stripline-to-stripline coupling. FIG. 5C is shown with the view as seen from the lower asymmetric stripline 565 at the front of the figure extending through the transition 573 to the upper asymmetric stripline 585 extending to the rear of the figure, that is the view in FIG. 5C is in the opposite direction of the view of FIG. 5A.

The sub-transition 573 is formed in multilayer build-up package substrate 550 with trace conductor layers 551, 553, and 555, and connection conductor layers 552, 554 and 556. The conductors are surrounded by and spaced from each other by dielectric layers 564, 562. The conductors can be formed from a plated conductor such as copper or copper alloy, gold or gold alloy, palladium or palladium alloy, or silver or silver alloy, and the dielectric layers can be of Ajinomoto build-up film (ABF), acrylonitrile butadiene styrene (ABS), acrylonitrile styrene acrylate (ASA), or resin epoxy such as mold compound. Solder 530 is shown below the transition 573 and coupling the connection conductor layer 556 at the board side surface to a PCB board or substrate. The lower asymmetric stripline 565 is formed in trace conductor layer 555, which also has ground planes formed on either side of the asymmetric stripline 565. The via shaped portion 581 (formed of connection conductor layer 554) couples the lower asymmetric stripline 565 to a pad connection 583 that contacts an end of the upper asymmetric stripline 585, which extends from the sub-transition 575 (see FIG. 5B). The via shaped portion 581 is formed in the connection conductor layer 554, and the upper asymmetric stripline 585 is formed in the trace conductor layer 553. The via shaped portion 581 has a diameter, for a target signal frequency of 196 GHz, of 55 microns. The lower asymmetric stripline 565 has a length "L3" of about 300 microns for a target frequency of 196 GHz. The spacing 582 between the lower asymmetric stripline 565 and the surrounding ground plane, labeled "G3", was determined as 55.5 microns, while the spacing 584 of the opening around the pad connection 583 to the ground planes, labeled "G4", was determined as 140 microns. The spacings G3, G4 and the length L3 are chosen for particular materials and thicknesses, and for the target frequency of 196 GHz, these spacings and lengths can vary for different materials and for different frequencies to obtain a sub-transition with low impedance, well matched impedances, and low loss.

FIG. 5CC illustrates in another S-parameter logarithmic graph, results obtained from simulations of the sub-transition 575. In FIG. 5CC, the curve 541 illustrates the S (1,1) result, indicating the reflection loss from one side of the sub-transition, the curve 543 illustrates the S (2,2) result, indicating the reflection loss from the opposite side of the sub-transition 575, and the curve 545 illustrates the S (2, 1) result, indicating the attenuation from one side to the other side of the sub-transition (forward gain). The frequency band illustrated in FIG. 5CC is the WR5 range, that is from 140 GHz to 220 GHz. The curve 541, the S (1,1) parameter curve, indicates the reflection loss is well below the −10 dB line, for the entire frequency band. Similarly, the curve 543, the S (2, 2) parameter curve, is also below −10 dB for the entire frequency band, The curve 545, the attenuation or forward gain, is less than −1 dB across the range. The sub-transition 575 is therefore shown in simulation to be a low impedance, well matched element.

Figure 5D:
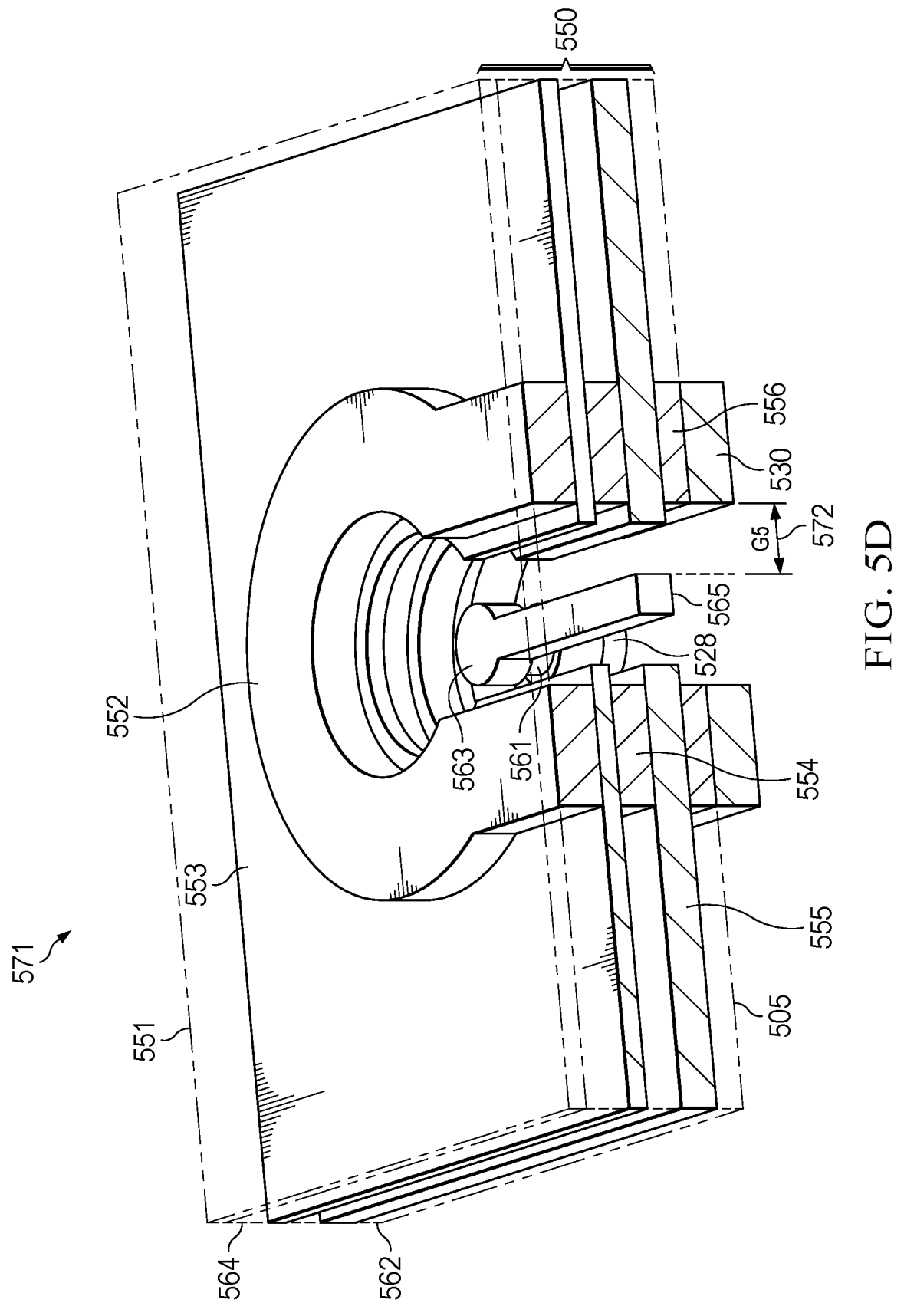
Figure 5D:
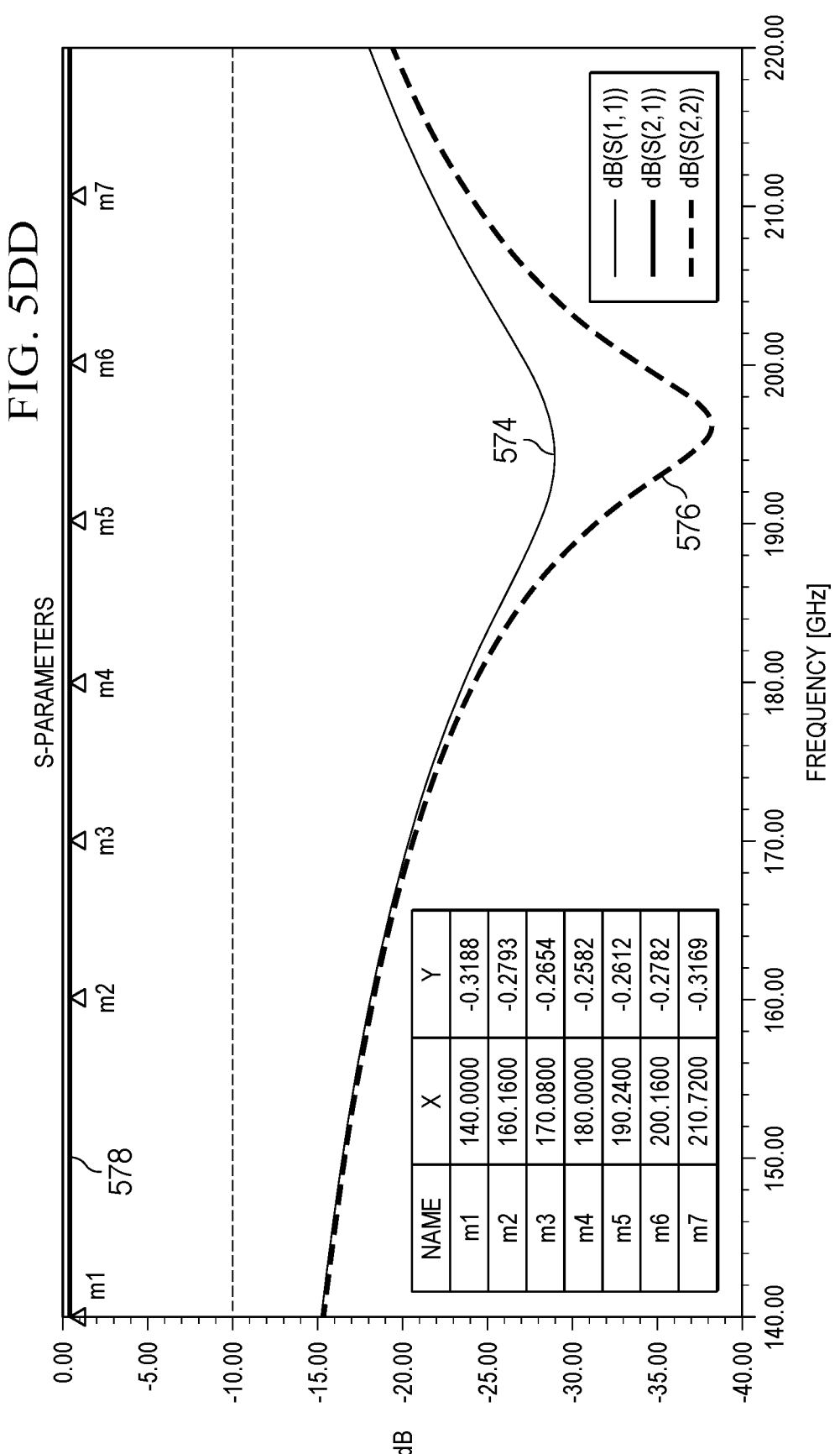
Figure 5E:
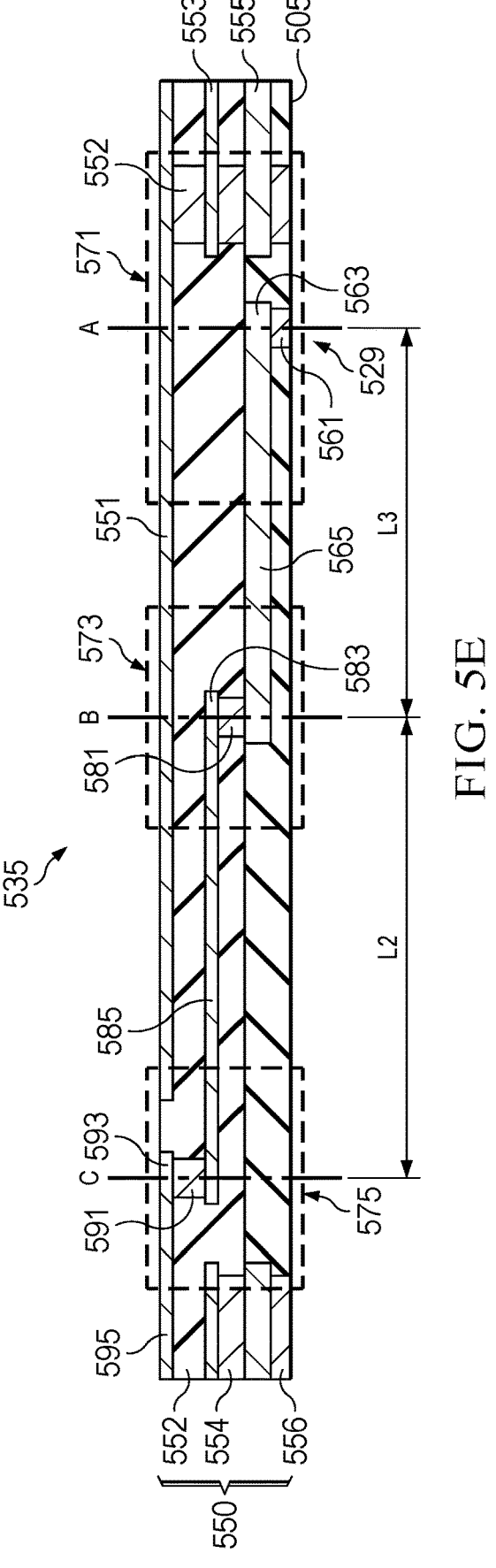
FIG. 5E illustrates in a cross-sectional view the multilayer build-up package substrate used to form the waveguide transition of FIG. 5A, and FIG. 5EE illustrates, in another S-parameter graph, a simulation result for the waveguide transition of FIG. 5A.
Figure 5E:
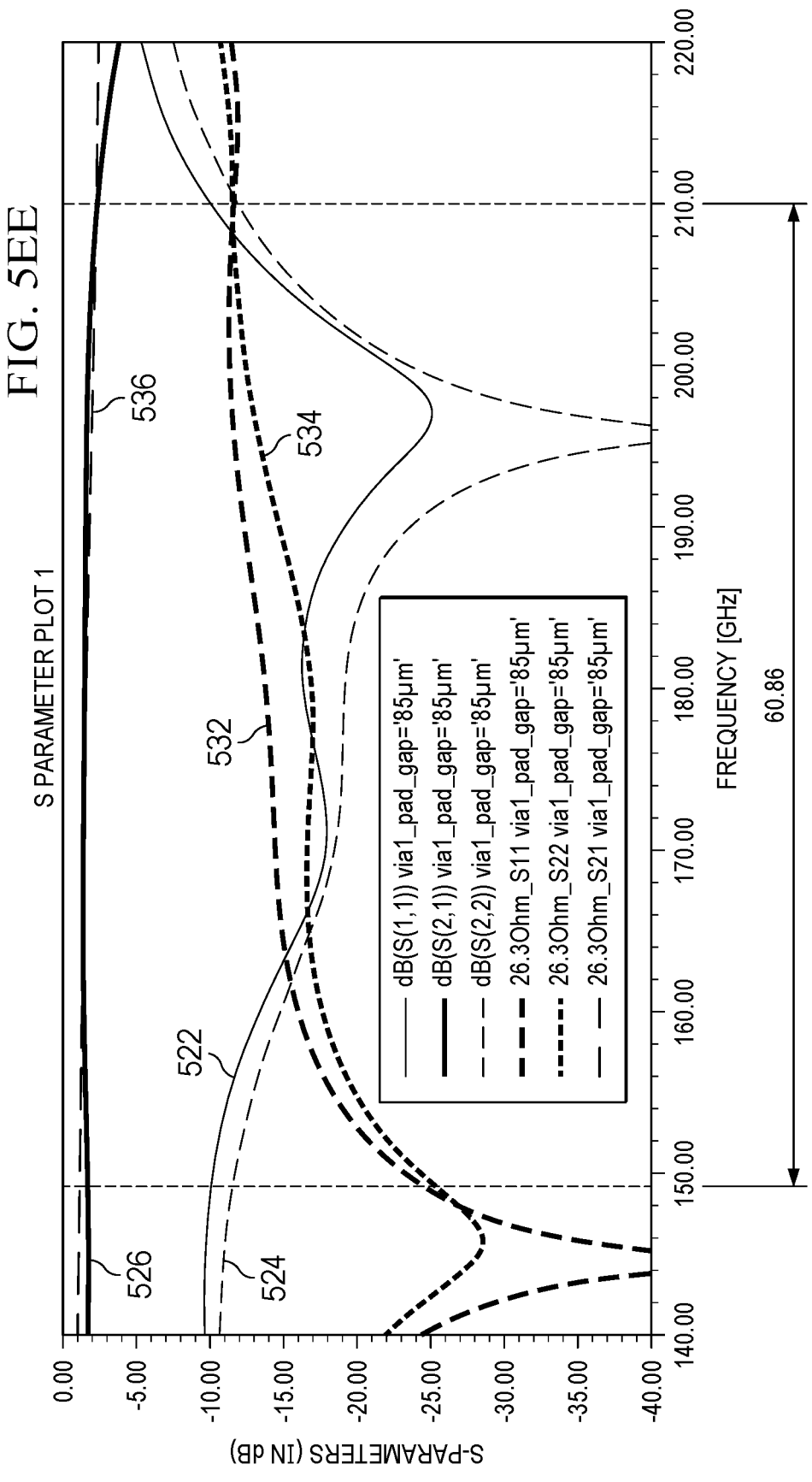
Figure 5F:
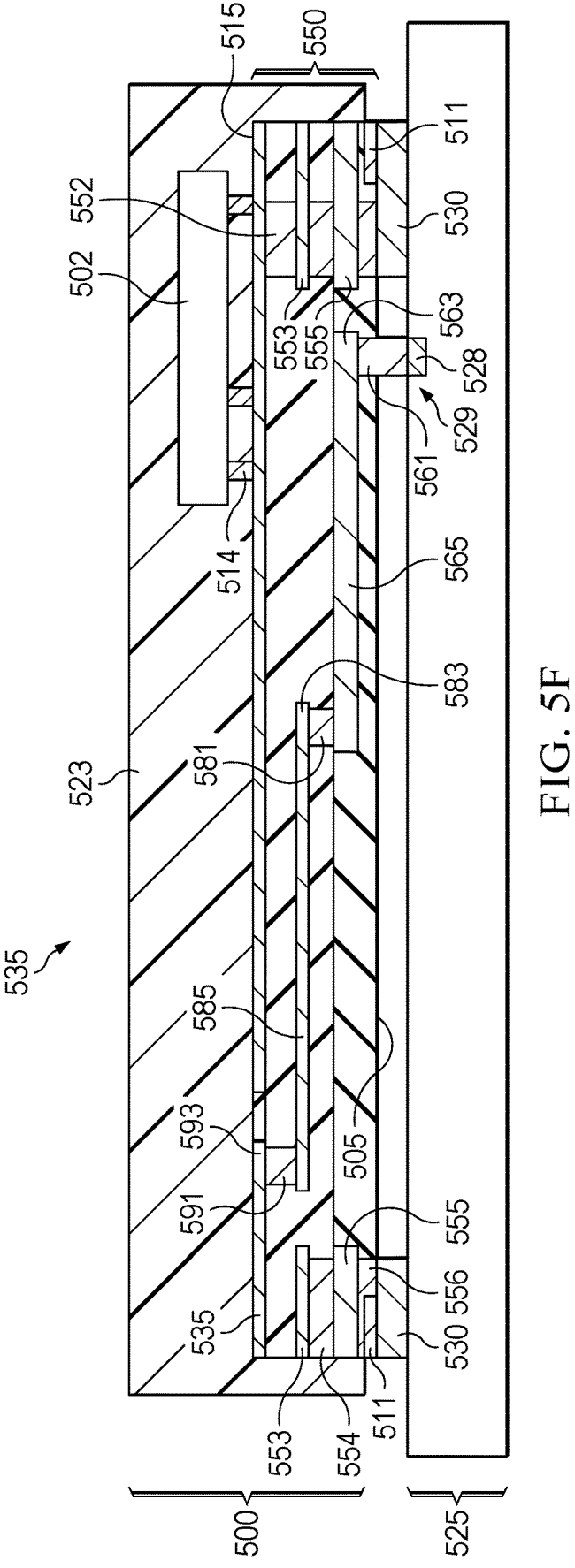
FIG. 5F illustrates in another cross-sectional view, a microelectronic device package arrangement including the waveguide transition of FIG. 5A.

FIG. 5D illustrates, in a projection view similar to the projection views of FIGS. 5B and 5C, details of the first sub-transition 571 (see FIG. 5A) that couples the input port of the waveguide transition to a PCB pin input, for example, by a solder connection on a board side surface (see 228 in FIG. 2A, for example). In FIG. 5D, the multilayer build-up package substrate 550 is again shown with trace conductor layers 551, 553 and 555 spaced apart, connection conductor layers 552, 554 and 556 between and connecting portions of the trace conductor layers, and the conductor layers surround dielectric material layers 564, 562. The sub-transition 571 couples the input port formed by via shaped portion 561 on the board side surface 505 of the waveguide transition to the lower asymmetric stripline 565 at pad connection 563. The sub-transition 571 is shown looking from the lower asymmetric stripline 565, in a opposite direction from the view of FIG. 5A.

The first sub-transition 571 has spacing 572, labeled "G5", between the pad connection 563 at one end of the lower asymmetric stripline 565 and the ground planes formed around and spaced from the pad connection 563 of about 80 microns for the target frequency of 196 GHz. The lower asymmetric stripline 565 has a length "L3" from sub-transition 573 (see L3 in FIG. 5C) to sub-transition in FIG. 5D of about 300 microns.

FIG. 5DD illustrates, in another S-parameter graph, the S-parameter logarithmic plots for the example sub-transition 571 shown in FIG. 5D, showing simulation results plotted for the WR5 frequencies from 140 GHz to 220 GHz. The curve 574 is a logarithmic graph of the S (1,1) parameter, showing the reflection loss at one side of the sub-transition 571 is less than –10 dB for the entire frequency range, demonstrating broad bandwidth in the WR5 frequencies. The curve 576 similarly is a logarithmic graph of the S (2,2) parameters, showing the reflective loss from the other side of the sub-transition 571 is also less than –10 dB across the frequencies of interest. The curve 578 illustrates the S (2,1) parameter plot, showing the attenuation or forward gain of the sub-transition 571 is less than –0.5 dB across the WR5 frequencies.

By designing each of the first, second, and third sub-transitions 571, 573, and 575 as a quarter-wave transformer that has low reflection loss and low attenuation with good impedance matching, the waveguide transition 535, shown in FIG. 5A, which combines the three sub-transitions, will also have good performance in the frequencies of interest.

FIG. 5E illustrates, in a cross-sectional view, the waveguide transition 535, showing additional details. A signal traverses the path between an input port 529 at the board side surface 505 of the waveguide transition 535 and up to the coplanar waveguide 595 on the device side surface 515. The sub-transitions 571, 573, and 575 are spaced apart laterally by the lengths L2, L3 (see FIGS. 5B and 5C, above). In addition to using the gaps between elements to match impedances for the individual sub-transitions, in the arrangements additional impedance matching is performed by using a multi-level impedance matching technique in arranging the sub-transitions to form the waveguide transition. In this manner, the waveguide transition of the arrangements can advantageously have optimized return loss, and well matched, low impedance.

A signal path from the input port 529 on the board side surface 505 to the device side surface 515 of the waveguide transition 535 starts at the via shaped portion 561 in the connection conductor layer 556. The first sub-transition 571 couples the input to the lower asymmetric stripline 565. The second sub-transition 573 then couples the signal to the upper asymmetric stripline 585, the via shaped portion 581 connecting the lower asymmetric stripline 565 to a pad connection 583 of the upper asymmetric stripline 585. The third sub-transition 575 couples the signal from the upper asymmetric stripline 585 to the coplanar waveguide 595. The via shaped portion 591 couples the upper asymmetric stripline 585 to a pad connection 593 of the coplanar waveguide 595.

The locations of the sub-transitions 571, 573, and 575 are indicated by the labels "A", "B", and "C" on the dashed lines through the centers of the via shaped portions 561, 581 and 591 in the connection conductor layers 556, 554 and 552. The input port 529 and the via shaped connector 561 form an input on the board side surface 505 of the waveguide transition 535. The coplanar waveguide 595 is an output port (in one direction, from the board side surface to the device side surface 515; signals can also traverse the waveguide transition 535 in the opposite direction from the device side surface to the board side surface).

The length L2 between the positions A and B, and the length L3 between the positions B and C, can be used to match impedances in the arrangements by making these lengths proportional to a quarter-wavelength of a signal at a frequency of interest. The relationships are shown in Equations 1 and 2:

$$L2 \sim (2n+1)\lambda_1/4n = 0,1,2 \qquad \text{Equation 1}$$

$$L3 \sim (2n+1)\lambda_2/4n = 0,1,2 \qquad \text{Equation 2}$$

Where n is a positive integer ranging from zero to infinity.

For a signal traversing the waveguide transition 535 from the input port 529 at point A to the coplanar waveguide 595 at point C, $\lambda_1$ is equal to $\lambda_2$. In the examples described above, L1 and L2 were determined to be about 300 microns. The wavelength for a 196 GHz signal (in air) is about 1500 microns, so the lengths L1, L2 are in the quarter wavelength range. Variable n is an integer and can vary from 0 to infinity so the lengths L2, L3 are odd multiples of a quarter wavelength. By using this spacing between the sub-transitions to provide impedance matching, the waveguide transition 535 can be optimized for a given frequency of interest or for a range of frequencies in a bandwidth of interest.

The total length of the waveguide transition 535 shown in FIG. 5A is the sum of the lengths L1, L2, and L3, or about 900 microns in the illustrated example, just under 1 millimeter. As quad flat no-lead (QFN) packages can vary in size from a couple of millimeters square to about seven millimeters on a side, the waveguide transitions of the arrangements are very compatible with microelectronic device packages, and are small enough to leave room for forming antennas on the device side surface of the multilayer build-up package substrate 550 including the waveguide transition 535, and to leave additional room for mounting a semiconductor die coupled to the coplanar waveguide, for passive components such as capacitors, or for additional routing area on the device side surface of the multilayer build-up package substrate.

FIG. 5EE illustrates, in another S-parameter graph, simulated performance results for the waveguide transition 535 (see FIG. 5A) including the sub-transitions 571, 573 and 575 described above. In FIG. 5EE, the curve labeled 532 illustrates the S (1,1) parameter in a logarithmic plot for a simulation using an ideal feed impedance looking into the input port on the board side surface of the waveguide transition 535 of 26.3 Ohms. The curve labeled 534 illustrates the S (2,2) parameter. For the WR5 frequency range of 140 GHz to 220 GHz shown on the X-axis of the graph, the curves 532, 534 show the reflectivity loss for each direction of the waveguide transition is less than –10 dB for the entire band of interest, a bandwidth of 80 GHz. Curve 534 illustrates the S (2,1) parameter plot, the attenuation or forward gain, over the 80 GHz bandwidth shown, the attenuation maximum was –2.33 dB at 220 GHz.

Again referring to FIG. 5EE, simulation results are also plotted for an input impedance of 50 Ohms looking into the input port (see 529 in FIG. 5E) on the board side of the waveguide transition 535 (see FIGS. 5A, 5E). Curves 522 and 524 illustrate the reflectivity loss by plotting the S (1,1) and S (2,2) parameters. For the Ohm case, the waveguide transition 535 shows loss of less than –10 dB for most of the WR5 range, from 150 GHz to about 210 GHz. Curve 526 illustrates the attenuation for the 50 Ohm impedance case, the simulation shows that the attenuation is about –2.23 dB at 214 GHz. Thus, the waveguide transition 535 provides low signal reflectivity and low attenuation loss over almost the entire WR5 frequency range.

To further illustrate the advantages of the arrangements, and for comparison, a simulation was performed using a single transition with a vertical stack of via shaped portions and pad connections formed of the same multilayer build-up package substrate. The single transition consisted of via shaped portions formed in the connection layer conductors and pad connections in the trace level conductors from an input port at the board side surface to the coplanar waveguide in the uppermost trace conductor layer on the device side surface. The same materials and thicknesses were used. The single transition could not be tuned to provide −10 dB bandwidth for the WR5 range, the reflectivity loss was greater than −10 dB over the entire WR5 range. The use of the sub-transitions (see 571, 573, 575 in FIG. 5A) spaced from one another in the arrangements increases the performance of the waveguide transition 535, enabling a matched impedance, low attenuation waveguide transition that can be integrated into a microelectronic device package and which can be surface mounted to a PCB or module. The waveguide transition 535 of the example arrangement was also evaluated in simulation for signal leakage and to check isolation of the device. No significant leakage was observed, only a small edge effect in the coplanar waveguide at the device side surface was observed.

The example arrangements described herein show waveguide transitions formed in multilayer build-up package substrates with three trace conductor layers spaced apart by dielectric, and having three connection conductor layers, which can couple the trace conductor layers through the dielectric, the connection conductor layers can be shaped to form via shaped portions or to form ground planes. In additional alternative arrangements, more or fewer trace conductor layers or connection conductor layers can be used in the multilayer build-up package substrate to form a waveguide transition. The spacing between elements, the lengths of striplines between the sub-transitions, and the thicknesses of the conductors can be varied to form additional arrangements. The use of multiple sub-transitions spaced apart to form a waveguide transition in a multilayer build-up package substrate provides the ability to match impedances and reduce attenuation in the waveguide transition by varying the spacing between elements, as well as by varying the gaps between ground planes and the transition via shaped portions. Simulations can be used to design each sub-transition as a quarter wave transformer, the combined sub-transitions then form a waveguide transition with good performance. Compared to expensive PCB designs, the waveguide transitions of the arrangements are low in cost and can be made integral to a microelectronic device package with antennas, semiconductor dies, or other elements in a multilayer build-up package substrate.

FIG. 5F illustrates, in a cross-sectional view, an example microelectronic device package 500 including the waveguide transition 535. In the illustrated example of FIG. 5F, a semiconductor die 502 is flip chip mounted to the device side surface 515 using post connects 514, which are soldered to the multilayer build-up package substrate 550. Mold compound 523 is shown covering the device side surface 515 of the waveguide transition 535, and covering semiconductor die 502. In an alternative arrangement, a metal cover or shield can be used. Traces in the multilayer build-up package substrate 550 couple the semiconductor die 502 to terminals 511, which can be formed of the connection conductor layer on the board side surface 505. As shown in FIG. 5F, the microelectronic device package 500 can form a no-lead device package, such as a quad flat no-lead ("QFN") or small outline no-lead ("SON") type packages. The microelectronic device package 500 can be surface mounted to a PCB 525, which similar to PCB 225 (see FIG. 2A, for example) carries a signal in a substrate integrated waveguide (not shown in FIG. 5F for simplicity of illustration, see 226 in FIG. 2A, for example). The waveguide transition 535 is coupled to the PCB 525 by the pin 528 and solder 530. An input port 529 to the waveguide transition 535 is formed in a connection conductor layer at the board side surface 505 of the waveguide transition.

FIG. 6 illustrates, in a flow diagram, steps for forming an arrangement. At step 601, the method begins by forming a multilayer build-up package substrate including conductors arranged as trace conductor layers spaced from one another by dielectric material, and comprising connection conductor layers configured to couple portions of the trace conductor layers through the dielectric material, the multilayer package substrate having a trace conductor layer at the device side surface and an opposing board side surface with a connection conductor layer at the board side surface. (See FIG. 3A, FIG. 5E, for example).

At step 603, the method continues by forming a waveguide transition from the multilayer build-up package substrate, the waveguide transition having an input port formed from a connection conductor layer at the board side surface, and having at least two sub-transitions spaced laterally from one another and configured to couple a signal from the input port through the trace conductor layers and the connection conductor layers to a coplanar waveguide formed from the trace conductor layer at the device side surface. (See FIG. 3A, FIG. 5A, for example).

FIG. 7 illustrates, in a flow diagram, steps for forming a multilayer build-up package substrate for use in an arrangement. At step 701, the first trace conductor layer is patterned over a carrier (see, for example, trace conductor layer 451 in FIG. 4A, step 403). At step 703, the first connection conductor layer is patterned onto the trace conductor layer (see, for example. the first connection level conductors 452 in FIG. 4A, step 405). At step 705, a dielectric material is deposited to form a dielectric layer over the first connection conductor layer and the first trace conductor layer. (See, for example, the dielectric layer 461 in FIG. 4A, at step 407).

At step 707, the method continues by grinding the dielectric layer to expose the first connection conductor layer (see, for example, step 409 in FIG. 4A). At step 709, additional trace conductor layers and connection conductor layers are patterned over the first connection conductor layer to form a multilayer package substrate. (See, FIG. 4B, steps 411-419).

The use of the arrangements provides a microelectronic device package including a multilayer build-up package substrate with an integral waveguide transition. In some arrangements the multilayer build-up package substrate can include an antenna (or antennas), and in some arrangements, the microelectronic device package can include a semiconductor die mounted to the multilayer build-up package substrate. Existing materials and assembly tools are used to form the arrangements, and the arrangements are low in cost when compared to solutions using a discrete laminate substrate to form waveguide transitions. The arrangements are formed using existing methods, materials, and tooling for making the devices and are cost effective.

Modifications are possible in the described arrangements, and other alternative arrangements are possible within the scope of the claims.

What is claimed is:

1. A method, comprising:

forming a multilayer build-up package substrate comprising conductors arranged as trace conductor layers spaced from one another by dielectric material and arranged as connection conductor layers coupling portions of the trace conductor layers through the dielectric material, the multilayer build-up package substrate having a trace conductor layer on a device side surface and having an opposing board side surface with a connection conductor layer on the board side surface;

forming a waveguide transition from the multilayer build-up package substrate, the waveguide transition having an input port formed from the connection conductor layer on the board side surface, and having at least two sub-transitions spaced laterally from one another and configured to couple a signal from the input port through the trace conductor layers and the connection conductor layers to a coplanar waveguide formed from the trace conductor layer on the device side surface; and forming an antenna from the trace conductor layer on the device side surface, wherein the antenna is coupled to the coplanar waveguide.

2. The method of claim 1, wherein forming the multilayer build-up package substrate comprises:

patterning a first trace conductor layer over a carrier;

patterning a first connection conductor layer over the first trace conductor layer;

depositing the dielectric material over the first connection conductor layer and the first trace conductor layer;

grinding the dielectric material to expose the first connection conductor layer; and patterning additional trace conductor layers, additional connection conductor layers, and depositing additional dielectric material over the additional trace conductor layers and over the additional connection conductor layers.

3. The method of claim 1, wherein forming the waveguide transition comprises:

forming a first sub-transition, a second sub-transition, and a third sub-transition, the first sub-transition coupling the input port at the board side surface to a lower stripline formed in a first one of the trace conductor layers, the second sub-transition spaced from the first sub-transition and coupling the lower stripline to an upper stripline formed in a second one of the trace conductor layers, and the third sub-transition spaced from the second sub-transition and coupling the upper stripline to the coplanar waveguide.

4. The method of claim 1, further comprising mounting a semiconductor die over the device side surface, the semiconductor die coupled to the coplanar waveguide by routing conductors in the trace conductor layer on the device side surface.

5. The method of claim 4, further comprising covering the semiconductor die and a portion of the multilayer build-up package substrate with mold compound or a lid to form a microelectronic device package.

6. The method of claim 3, wherein the upper stripline and the lower stripline are asymmetric striplines.

7. A microelectronic device package, comprising:

a multilayer build-up package substrate comprising conductors arranged as trace conductor layers spaced from one another by dielectric material and arranged as connection conductor layers configured to couple portions of the trace conductor layers through the dielectric material, the multilayer build-up package substrate having a device side surface with a trace conductor layer on the device side surface and an opposing board side surface with a connection conductor layer on the board side surface;

a waveguide transition formed from the multilayer build-up package substrate, the waveguide transition having an input port formed from the connection conductor layer on the board side surface, and having at least two sub-transitions spaced laterally from one another and coupling a signal from the input port through the trace conductor layers to a coplanar waveguide formed from the trace conductor layer on the device side surface; and mold compound covering the device side surface of the multilayer build-up package substrate, wherein the coplanar waveguide on the device side surface comprises a grounded coplanar waveguide.

8. The microelectronic device package of claim 7, wherein the at least two sub-transitions comprise:

a first sub-transition, a second sub-transition, and a third sub-transition, the first sub-transition coupling the input port at the board side surface to a lower stripline formed in a first one of the trace conductor layers, the second sub-transition spaced from the first sub-transition and coupling the lower stripline to an upper stripline formed in a second one of the trace conductor layers, and the third sub-transition spaced from the second sub-transition and coupling the upper stripline to the coplanar waveguide.

9. The microelectronic device package of claim 8, wherein the first sub-transition comprises:

the input port on the board side surface including a first via shaped portion; and a first pad connection at one end of the lower stripline formed in the first one of the trace conductor layers overlying and contacting the first via shaped portion.

10. The microelectronic device package of claim 9, wherein the second sub-transition comprises:

a second via shaped portion formed in a second connection conductor layer overlying and in contact with one end of the lower stripline; and a second pad connection formed in the second one of the trace conductor layers at one end of the upper stripline overlying and in contact with the second via shaped portion.

11. The microelectronic device package of claim 10, wherein the third sub-transition comprises:

a third via shaped portion formed in a third connection conductor layer overlying and in contact with one end of the upper stripline; and a third pad connection at one end of the coplanar waveguide, the third pad connection overlying and in contact with the third via shaped portion.

12. The microelectronic device package of claim 8, wherein the upper stripline and the lower stripline are asymmetric striplines.

13. The microelectronic device package of claim 8, wherein the lower stripline has a length between the first sub-transition and the second sub-transition, and the length is proportional to a quantity $(2n+1)*\lambda_1/4$, where n is an integer from 0 to infinity, and $\lambda_1$ is a wavelength of a frequency of a signal to be carried by the waveguide transition.

14. The microelectronic device package of claim 13, wherein the upper stripline has a length between the second sub-transition and the third sub-transition, and the length is proportional to a quantity $(2n+1)*\lambda_2/4$, where n is an integer from 0 to infinity, and $\lambda_2$ is the wavelength of the frequency of the signal to be carried by the waveguide transition.

15. The microelectronic device package of claim 14, wherein $\lambda_1 = \lambda_2$, and the frequency of the signal to be carried is between 30 GHz and 300 GHz.

16. The microelectronic device package of claim 14, wherein the frequency of the signal to be carried is between 140 GHz and 220 GHz.

17. The microelectronic device package of claim 14, wherein the frequency of the signal to be carried is about 196 GHz, and the length of the lower stripline and the length of the upper stripline are about 300 microns.

18. The microelectronic device package of claim 7, wherein the conductors comprise copper, gold, aluminum, silver, or an alloy thereof.

19. The microelectronic device package of claim 7, wherein the dielectric material comprises Ajinomoto build-up film (ABF), acrylonitrile butadiene styrene (ABS), acrylonitrile styrene acrylate (ASA), or resin epoxy.

20. The microelectronic device package of claim 7, further comprising:
a semiconductor die that is flip chip mounted to the device side surface of the multilayer build-up package substrate.

21. The microelectronic device package of claim 20, wherein the semiconductor die comprises a transceiver, a receiver, or a transmitter.

22. The microelectronic device package of claim 7, wherein the multilayer build-up package substrate has a substrate thickness of about 200 microns.

23. The microelectronic device package of claim 7, wherein the multilayer build-up package substrate has at least three trace conductor layers and at least three connection conductor layers.

24. The microelectronic device package of claim 7, further comprising at least one antenna formed on the device side surface of the multilayer build-up package substrate and coupled to the coplanar waveguide.

25. A device, comprising:
a multilayer build-up package substrate comprising trace conductor layers spaced from one another by dielectric material, and further comprising connection conductor layers coupling portions of the trace conductor layers through the dielectric material, the multilayer build-up package substrate having a device side surface with one of the trace conductor layers on the device side surface and an opposing board side surface with one of the connection conductor layers on the board side surface; and
a waveguide transition formed from the multilayer build-up package substrate, the waveguide transition having an input port formed from the one of the connection conductor layers on the board side surface, and having at least two sub-transitions spaced laterally from one another, the at least two sub-transitions configured to couple a signal from the input port through the trace conductor layers and the connection conductor layers to a coplanar waveguide formed from the one of the trace conductor layers on the device side surface, wherein the coplanar waveguide is a grounded coplanar waveguide.

26. The device of claim 25, wherein the at least two sub-transitions comprise:
a first sub-transition, a second sub-transition, and a third sub-transition, the first sub-transition coupling the input port on the board side surface to a lower stripline formed in a first one of the trace conductor layers, the second sub-transition spaced from the first sub-transition and coupling the lower stripline to an upper stripline formed in a second one of the trace conductor layers, and the third sub-transition spaced from the second sub-transition and coupling the upper stripline to the coplanar waveguide.

27. The device of claim 26, wherein the first sub-transition comprises:
the input port on the board side surface comprising a first via shaped portion; and
a first pad connection at a first end of the lower stripline which is formed in the first one of the trace conductor layers overlying and contacting the first via shaped portion.

28. The device of claim 26, wherein the second sub-transition comprises:
a second via shaped portion formed in a second one of the connection conductor layers overlying and in contact with a second end of the lower stripline; and
a second pad connection formed in the second one of the trace conductor layers at a first end of the upper stripline, the second pad connection overlying and in contact with the second via shaped portion.

29. The device of claim 26, wherein the third sub-transition comprises:
a third via shaped portion formed in a third connection conductor layer overlying and in contact with a second end of the upper stripline; and
a third pad connection at an end of the coplanar waveguide, the third pad connection overlying and in contact with the third via shaped portion.

30. The device of claim 25, further comprising an antenna formed of the one of the trace conductor layers on the device side surface of the multilayer build-up package substrate and coupled to the coplanar waveguide.

31. The device of claim 30, wherein the antenna is configured to receive or transmit signals having a frequency between 30 GHz and 300 GHz.

32. The device of claim 31, wherein the signals have a frequency between 140 GHz and 220 GHz.

* * * * *